(12) United States Patent
Geissler et al.

(10) Patent No.: US 10,403,609 B2
(45) Date of Patent: Sep. 3, 2019

(54) SYSTEM-IN-PACKAGE DEVICES AND METHODS FOR FORMING SYSTEM-IN-PACKAGE DEVICES

(71) Applicant: Intel IP Corporation, Santa Clara, CA (US)

(72) Inventors: Christian Geissler, Teugn (DE); Sven Albers, Regensburg (DE); Georg Seidemann, Landshut (DE); Andreas Wolter, Regensburg (DE); Klaus Reingruber, Langquaid (DE); Thomas Wagner, Regelsbach (DE); Marc Dittes, Regensburg (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 15/776,475

(22) PCT Filed: Dec. 21, 2015

(86) PCT No.: PCT/IB2015/059829
§ 371 (c)(1),
(2) Date: May 16, 2018

(87) PCT Pub. No.: WO2017/109536
PCT Pub. Date: Jun. 29, 2017

(65) Prior Publication Data
US 2018/0331080 A1  Nov. 15, 2018

(51) Int. Cl.
*H01L 23/02* (2006.01)
*H01L 25/16* (2006.01)
(Continued)

(52) U.S. Cl.
CPC .............. *H01L 25/16* (2013.01); *H01L 23/48* (2013.01); *H01L 23/49827* (2013.01);
(Continued)

(58) Field of Classification Search
CPC .............. H01L 23/48; H01L 23/49827; H01L 23/5384; H01L 24/19; H01L 24/20;
(Continued)

(56) References Cited

U.S. PATENT DOCUMENTS 9,478,474 B2 * 10/2016 Chen .................... H01L 23/3128
9,583,460 B2 *  2/2017 Ray .......................... H01L 24/19
(Continued)

*Primary Examiner* — Luan C Thai
(74) *Attorney, Agent, or Firm* — 2SPL Patent Attorneys Part mbB

(57) ABSTRACT

A system-in-package device includes at least three electrical device components arranged in a common package. A first electrical device component includes a first vertical dimension, a second electrical device component includes a second vertical dimension and a third electrical device component comprises a third vertical dimension. The first electrical device component and the second electrical device component are arranged side by side in the common package. Further, the third electrical device component is arranged on top of the first electrical device component in the common package. At least a part of the third electrical device component is arranged vertically between a front side level of the second electrical device component and a back side level of the second electrical device component.

25 Claims, 19 Drawing Sheets

(51) Int. Cl.
*H01L 23/48* (2006.01)
*H01L 25/065* (2006.01)
*H01L 25/07* (2006.01)
*H01L 23/00* (2006.01)
*H01L 23/498* (2006.01)
*H01L 23/538* (2006.01)
*H01L 21/56* (2006.01)

(52) U.S. Cl.
CPC .......... *H01L 23/5384* (2013.01); *H01L 24/19* (2013.01); *H01L 24/20* (2013.01); *H01L 24/24* (2013.01); *H01L 24/96* (2013.01); *H01L 25/065* (2013.01); *H01L 25/07* (2013.01); *H01L 21/568* (2013.01); *H01L 2224/04105* (2013.01); *H01L 2224/12105* (2013.01); *H01L 2224/16227* (2013.01); *H01L 2224/18* (2013.01); *H01L 2224/24137* (2013.01); *H01L 2224/24195* (2013.01); *H01L 2924/19105* (2013.01)

(58) Field of Classification Search
CPC ....... H01L 24/24; H01L 24/96; H01L 25/065; H01L 25/07; H01L 25/16
USPC .......................................................... 257/686
See application file for complete search history.

(56) References Cited

U.S. PATENT DOCUMENTS

| | | | |
|---|---|---|---|
| 9,633,974 B2* | 4/2017 | Zhai | ..................... H01L 25/0652 |
| 2009/0008763 A1 | 1/2009 | Kim et al. | |
| 2011/0248389 A1* | 10/2011 | Yorita | ................. H01L 23/3677 |
| | | | 257/659 |
| 2013/0049191 A1 | 2/2013 | Miura | |
| 2013/0099390 A1 | 4/2013 | Kurita et al. | |
| 2015/0235988 A1 | 8/2015 | Ray et al. | |

* cited by examiner

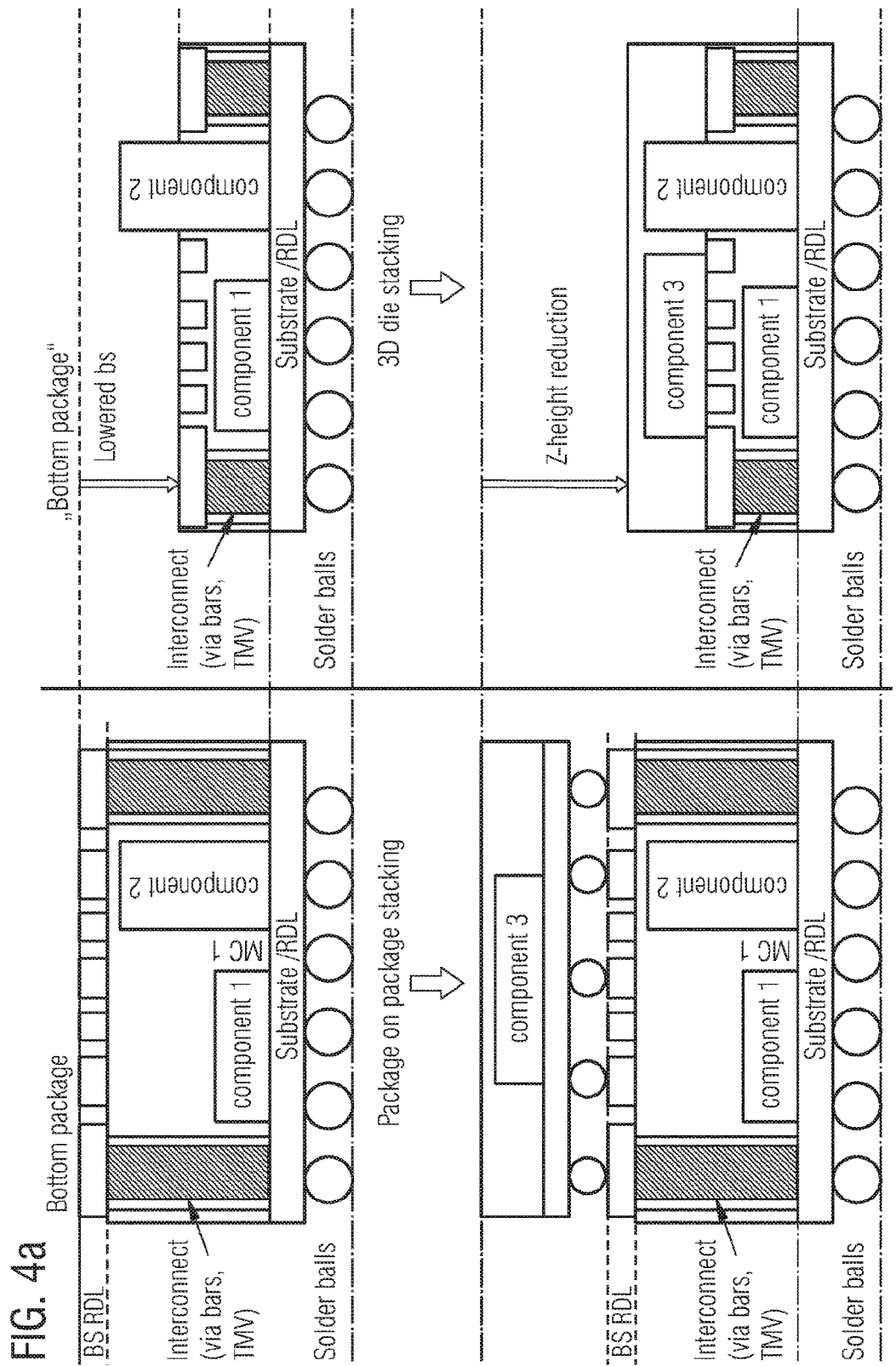

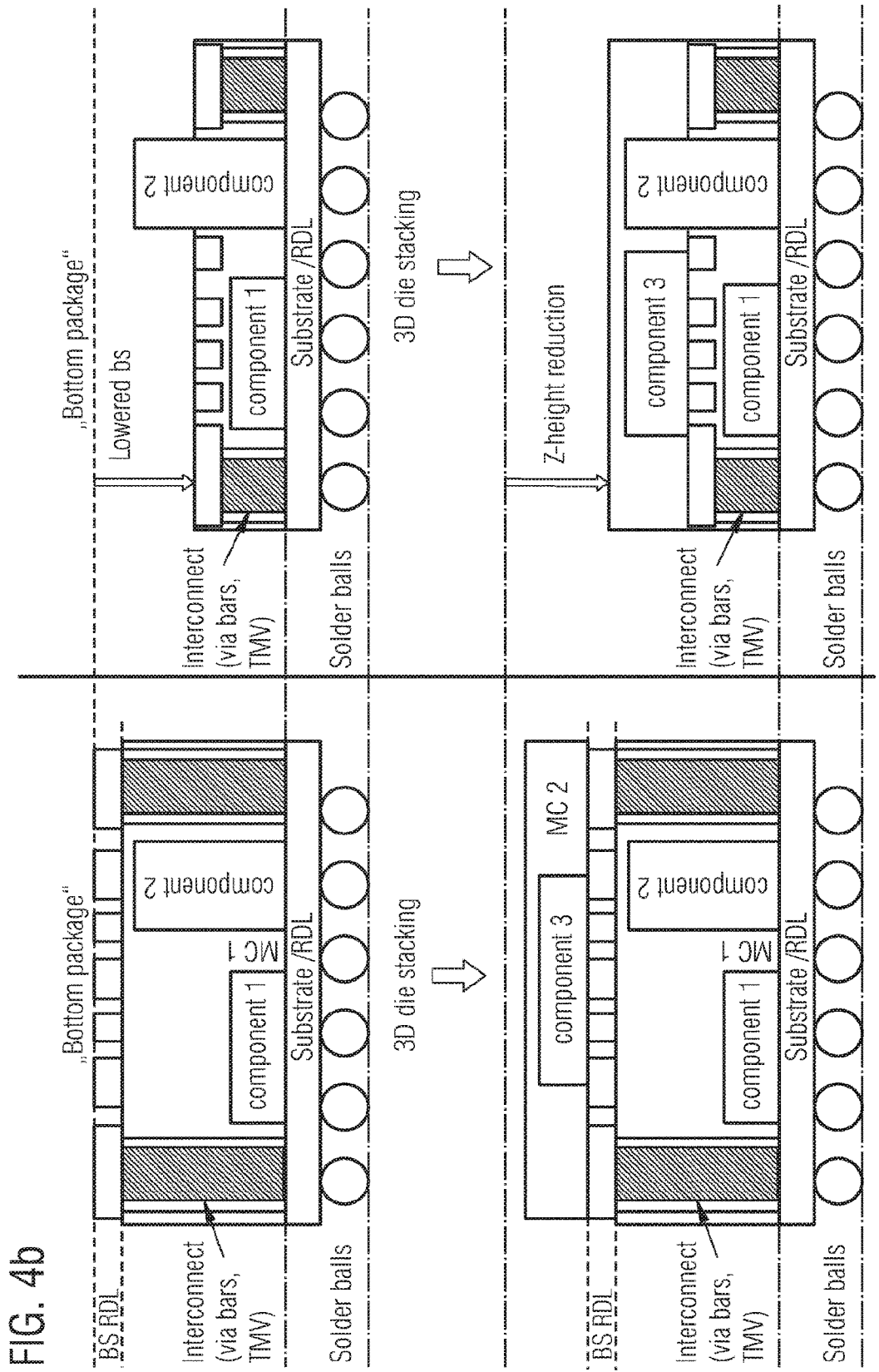

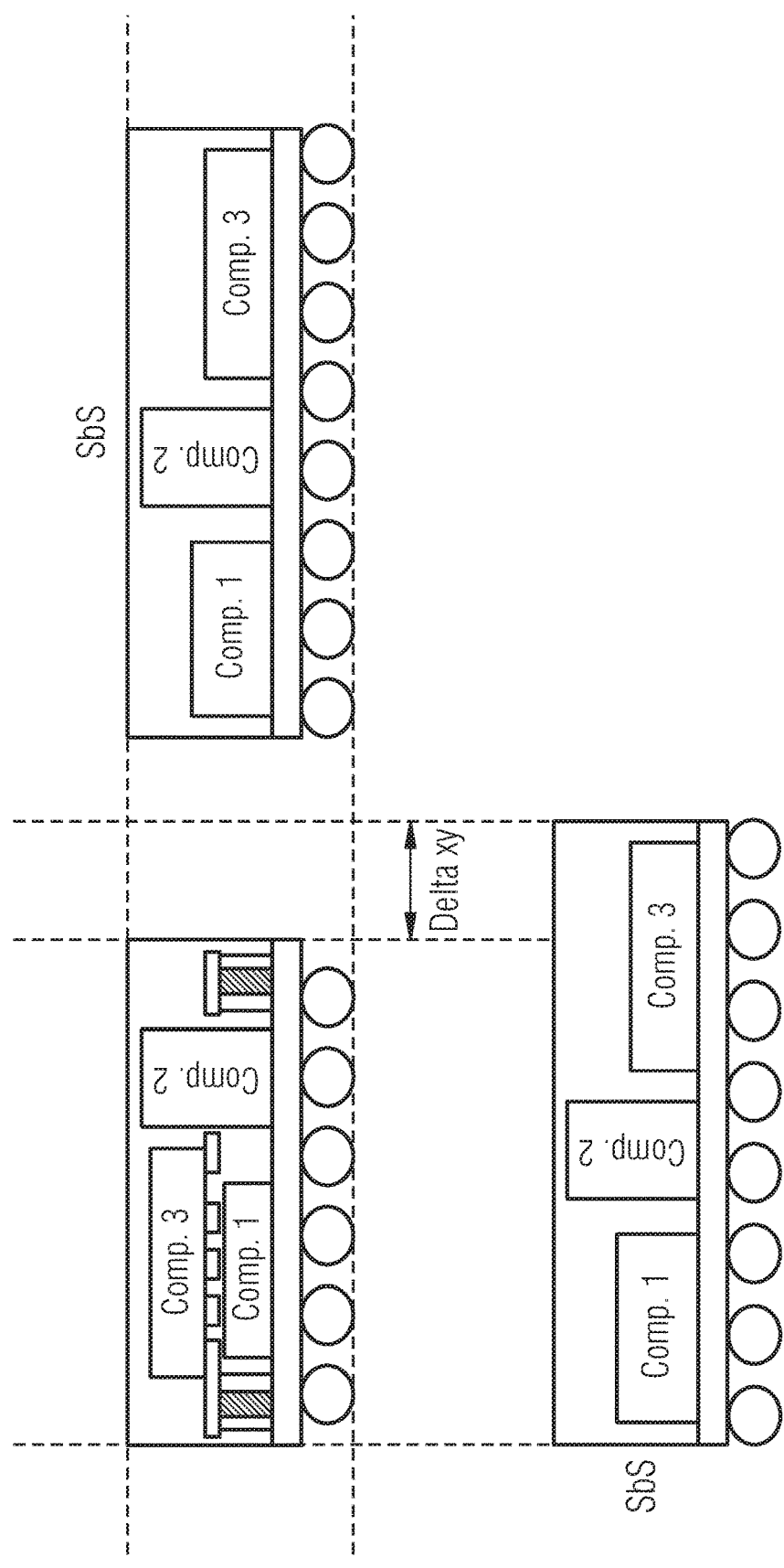

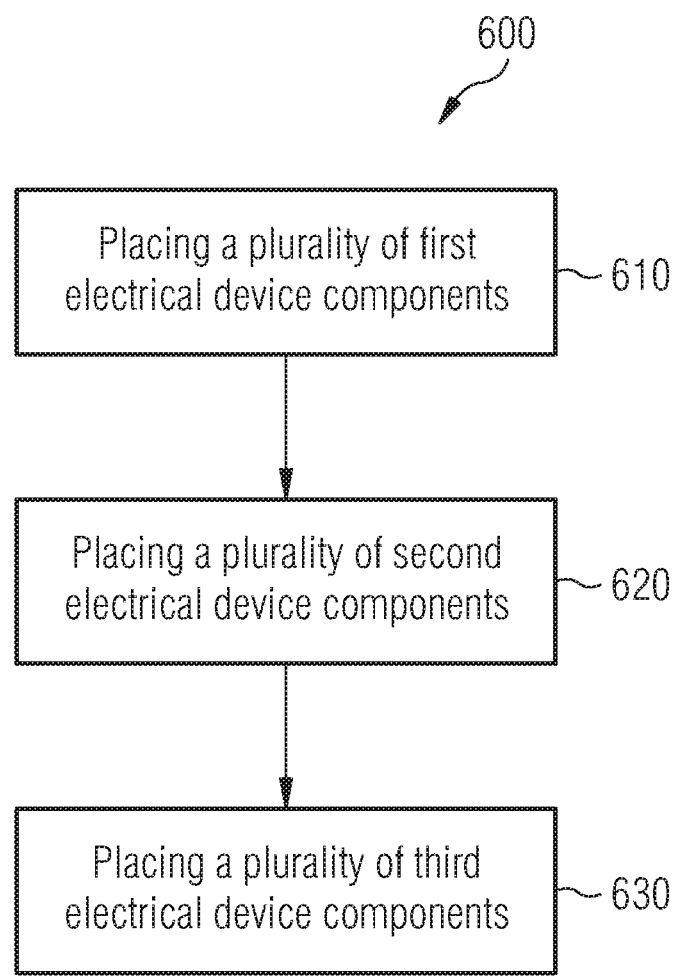

FIG. 9a
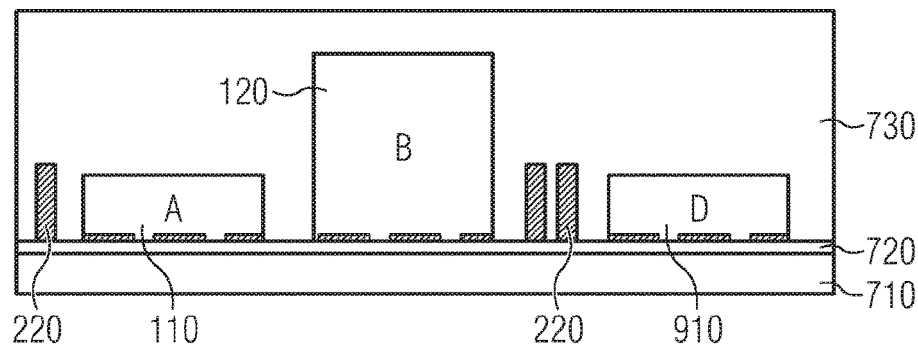
FIG. 9b
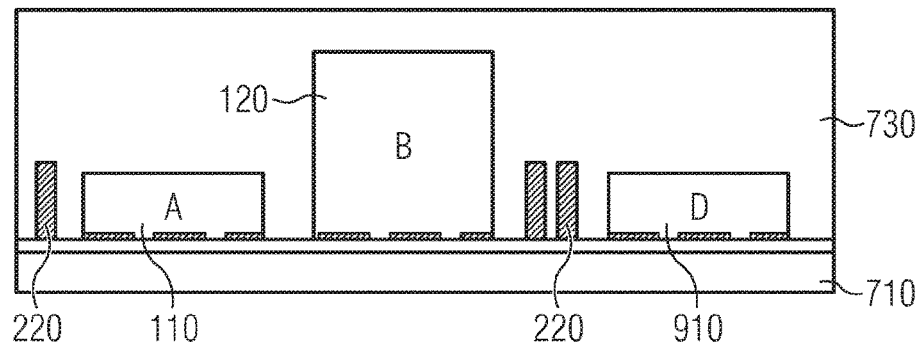
FIG. 9c
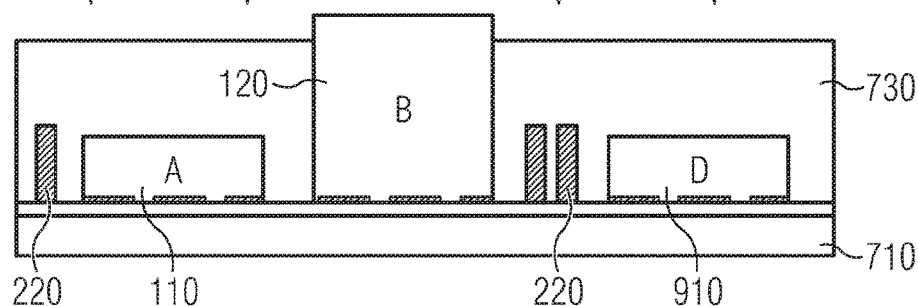

FIG. 11c
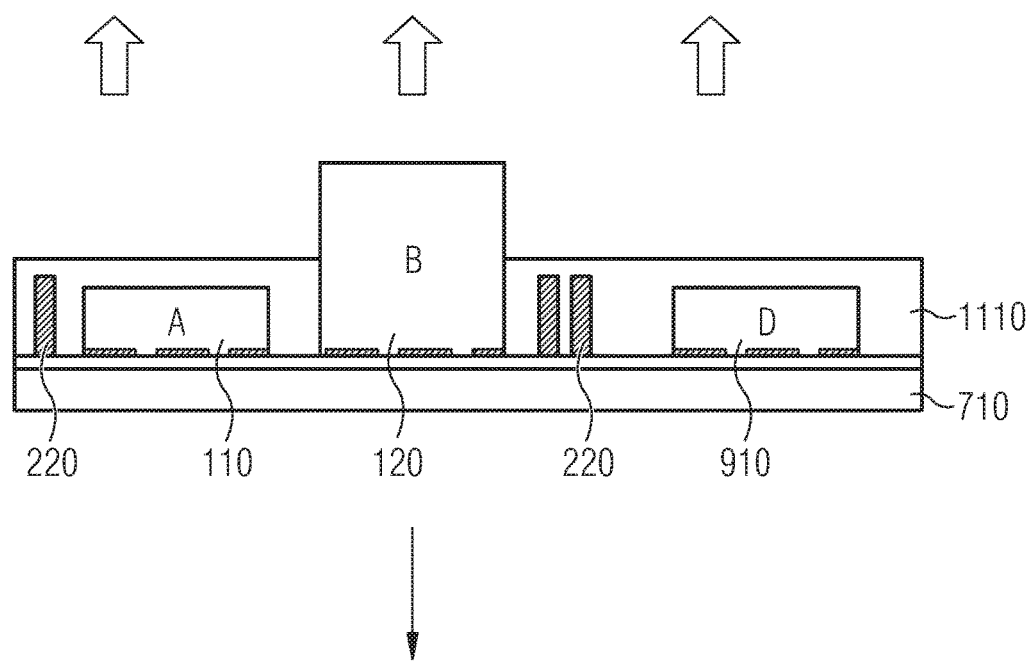
FIG. 11d
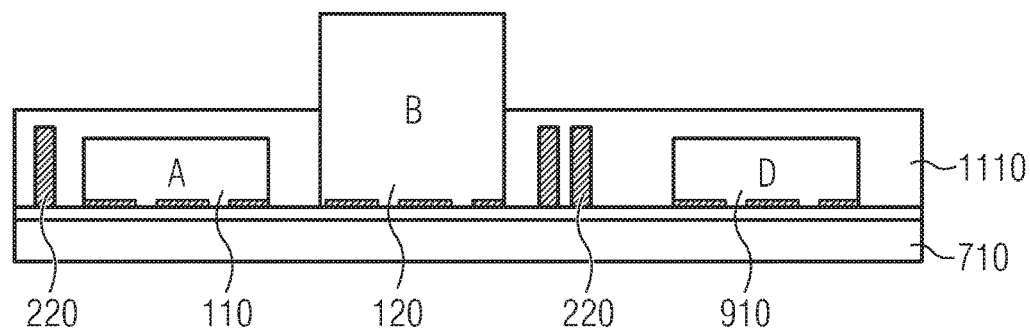

SYSTEM-IN-PACKAGE DEVICES AND METHODS FOR FORMING SYSTEM-IN-PACKAGE DEVICES

TECHNICAL FIELD

The present disclosure relates to packages for electrical components. In particular, some examples relate to system-in-package devices and methods for forming system-in-package devices.

BACKGROUND

For example, System in Package (SiP) integration is a trend in the semiconductor packaging industry to reduce the system form factor, costs and increase performance. Some approaches are side by side (SbS) die arrangements, 3D die stacking (3D), package on package (PoP) stacking and integration of passive components (integrated passive devices IPDs and surface mounted devices SMDs) into packages.

For example, the low z-height requirements for PoP (e.g. 1.0 mm) can limit the possibilities for integration of standard components like SMDs or MEMs (micro-electro-mechanical systems). Only flat components especially designed for system integration may be usable but that reduces flexibility and increases costs.

BRIEF DESCRIPTION OF THE FIGURES

Some examples of apparatuses and/or methods will be described in the following by way of example only, and with reference to the accompanying figures, in which

FIG. 4A shows a schematic comparison of a package on package stacking and a 3D die stacking;

FIG. 4B shows a schematic comparison of two different 3D die stacks;

FIG. 5 shows a schematic comparison of a side by side arrangement and a 3D die stacking;

FIG. 6 shows a flow chart of a method for forming system-in-package devices;

FIG. 9A-9E show schematic cross sections and a schematic top view of system-in-package devices at different stages of another manufacturing process;

FIG. 11A-11D show schematic cross sections of system-in-package devices at different stages of another manufacturing process.

DETAILED DESCRIPTION

Figure 1A:
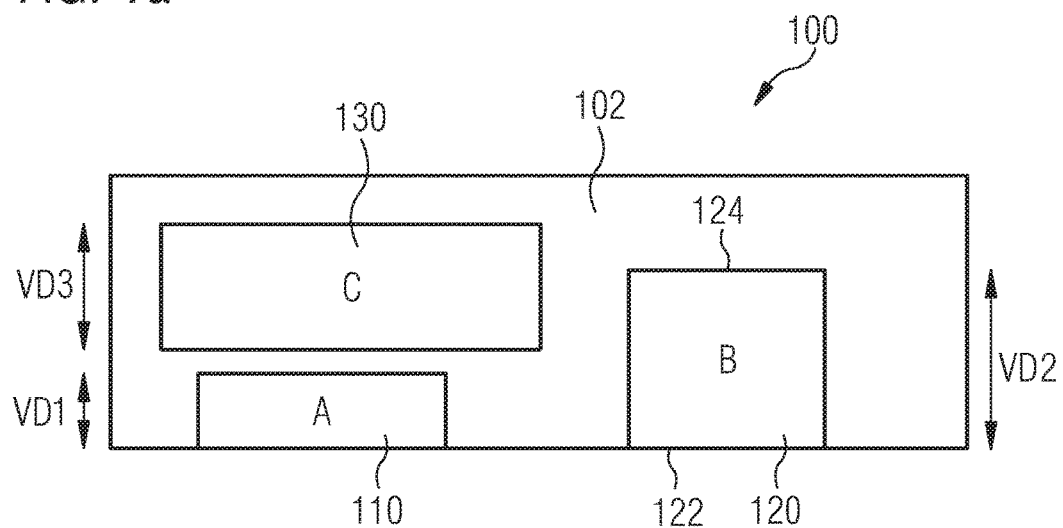
FIGS. 1A and 1B show a schematic cross section and a schematic top view of a system-in-package device with at least three electrical device components.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing illustrative examples only and is not intended to be limiting. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or electrical device components, but do not preclude the presence or addition of one or more other features, integers, steps, operations, elements, electrical device components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Electrical components or devices are embedded in packages to provide protection against impact and corrosion, to hold the contact pins or leads and/or to dissipate heat produced by the device, for example. For example, a semiconductor package may contain one or more semiconductor components. Individual components may be formed in a silicon wafer before being cut and assembled in a package. A semiconductor package may have only few leads or contacts for devices such as diodes, or may have hundreds of connections in case of a microprocessor, for example. In addition to providing connections to the semiconductor and handling waste heat, the semiconductor package can protect the semiconductor die against the ingress of moisture, for example. Similarly, non-semiconductor electrical components (e.g. resistors, capacitors, inductors) may be arranged in packages.

Figure 1B:
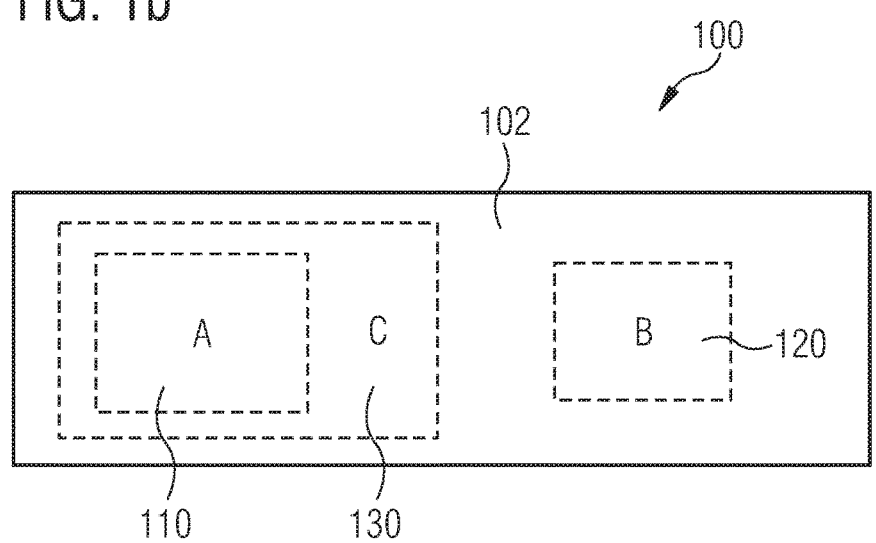

FIGS. 1A and 1B shows schematic illustrations of a system-in-package device 100 according to an example. The system-in-package device 100 comprises at least three electrical device components arranged in a common package 102. A first electrical device component A 110 of the at least three electrical device components comprises a first vertical dimension VD1, a second electrical device component B 120 of the at least three electrical device components comprises a second vertical dimension VD2 and a third electrical device component C 130 of the at least three electrical device components comprises a third vertical dimension VD3. Further, the second vertical dimension VD2 is larger than the first vertical dimension VD1. The second vertical dimension VD2 may be larger (FIG. 1A), equal or smaller (FIG. 1C) than the third vertical dimension VD3. The first electrical device component A 110 and the second electrical device 120 component are arranged side by side in the common package 102. Further, the third electrical device component C 130 is arranged (directly or indirectly) on top of the first electrical device component A 110 in the common package 102. At least a part of the third electrical device component C 130 is arranged vertically between a front side level 122 of the second electrical device component B 120 and a back side level 124 of the second electrical device component B 120.

The dimensions of a device with several electrical components may be significantly reduced by arranging the electrical components within a common package. The dimensions of the device may be further reduced by arranging thin components in a stack and placing thicker components side by side to the stack of thin components.

At least some of the electrical device components arranged in the common package 102 comprise different vertical dimensions, for example. The vertical dimension (e.g. z-height) of an electrical device component may be a dimension measured orthogonal to a front side surface or contact interface surface of the electrical device component. For example, the vertical dimension may be a maximal vertical dimension of the electrical device component, if the vertical dimension varies laterally. The front side surface or contact interface surface of the electrical device component may be a side comprising contact interfaces (e.g. if contact interfaces are arranged at on side of the electrical device component only) or a side comprising the largest number of contact interfaces of the electrical device component (e.g. if the electrical device component comprises a back side contact interface too, for example, back side metallization of a semiconductor die), for example. A front side level of an electrical device component may be defined by a plane through the front side surface of the electrical device component. Correspondingly, a back side level of an electrical device component may be defined by a plane through the back side surface of the electrical device component. Alternatively, the back side level of the electrical device component may be defined by a plane through a point at the back side surface of the electrical device component comprising the largest vertical distance to the front side surface and being in parallel to the front side surface.

Two electrical device components arranged side by side are arranged without lateral overlap in a top view system-in-package device 100 (e.g. first electrical device component A and second electrical device component B in FIG. 1B), for example. Further, two electrical device components arranged side by side may have an overlap in vertical direction (e.g. first electrical device component A and second electrical device component B in FIG. 1A). For example, a front side or back side of one of the two electrical device components may be arranged vertically between a front side level and a back side level of the other of the two electrical device components or vice versa. In an example, a front side surface of the first electrical device component A and a front side surface of the second electrical device component B are arranged on substantially the same level (e.g. neglecting differences due to different solder heights and/or manufacturing tolerances). For example, the first electrical device component A and the second electrical device component B may be placed, soldered or glued onto a common carrier or substrate during manufacturing of the system-in-package device 100. For example, contact interfaces at a front side of the first electrical device component A 110 and contact interfaces at a front side of the second electrical device component B 120 may be connected to a common front side redistribution structure (e.g. implementing electrical connections between the electrical device components of the system-in-package device and electrical connections to external devices and/or a printed circuit board). The common front side redistribution structure (or mutual front side redistribution structure or shared front side redistribution structure) may be a common front side redistribution layer structure, a common panel structure or a common flip chip substrate, for example.

Two electrical device components arranged (directly or indirectly, for example, with a redistribution layer structure in between) on top of each other (or in a stacked manner) are arranged without vertical overlap, for example. Further, two electrical device components arranged on top of each may have a lateral overlap in a top view of the system-in-package device 100.

For example, at least one of the at least three electrical device components may be a semiconductor device. Each of the at least three electrical device components may be a semiconductor device, an integrated passive device, a micro-electro-mechanical system device (e.g. air pressure measurement device or microphone), a surface mounted device or a package of an electrical device. For example, an electrical device component of the system-in-package device 100 may be in a component package to be embedded in the common package (e.g. surface mounted device or integrated passive device) or may be a semiconductor die to be soldered to a carrier, a substrate or a redistribution layer of the system-in-package device 100. For example, at least one of the at least three electrical device components may be a central processing unit, a memory device, a transmitter device, a receiver device or a transceiver device.

The common package 102 (or mutual package or shared package) may be a structure embedding the electrical device components of the system-in-package device 100. For example, the common package may comprise a molding compound embedding at least a part of the electrical device components of the system-in-package device 100. The common package may comprise a molding compound portion enclosing at least a part of the second electrical device component B 120 and at least a part of the third electrical device component C 130. For example, the molding compound and/or substrate or carrier of the common package 102 may form an outer surface of the system-in-package device 100 at one or more sides of the system-in-package device 100 (e.g. all sides except for a front side surface of the system-in-package device used as contact interface side for connecting the system-in-package device to other devices or a printed circuit board). The common package 102 may protect the electrical device components of the system-in-package device 100 against environmental influences (e.g. moisture and/or mechanical forces). Alternatively, a part of one or more components (e.g. second or third electrical device component C) of the system-in-package device 100 may stay uncovered by the molding compound to enable an external influence to the component (e.g. pressure measurement device or microphone). For example, the common package or a portion of a molding compound of the common package 102 may comprise an extrusion leaving an opening from outside to an electrical device components. The common package 102 may be a fan-out wafer-level system-in-package, a fan-out panel system-in-package or a flip chip system-in-package.

The system-in-package device 100 may be any electronic device using several electrical components. For example, the system-in-package device 100 may be a wireless device (e.g. receiver component, transmitter component or transceiver component together with passive components, power management component and/or signal processing component), a multi-chip device (e.g. including a central processing unit CPU in combination with other components, for example, memory components) or a memory device (e.g. comprising one or more flash components, dynamic random access memory DRAM components, static random access memory SRAM components and/or memory controller component).

The system-in-package device 100 may comprise a significantly smaller vertical size in comparison to a package on package arrangement of electrical device components of the system-in-package device 100 (e.g. FIG. 4A). The system-in-package device 100 may comprise a significantly smaller lateral size in comparison to a side by side arrangement of all electrical device components of the system-in-package device 100 (e.g. FIG. 5).

The system-in-package device 100 (or the common package of the system-in-package device) may comprise a vertical dimension of less than a sum of the first vertical dimension VD1, the second vertical dimension VD2 and the third vertical dimension VD3. For example, the system-in-package device 100 (or the common package of the system-in-package device) may comprise a vertical dimension of less than 5 mm (or less than 2 mm or less than 1 mm). The system-in-package device 100 (or the common package of the system-in-package device) may comprise a lateral dimension of less than a sum of a lateral dimension of the first electrical device component A 110, a lateral dimension of the second electrical device component B 120 and a lateral dimension of the third electrical device component C 130. For example, the system-in-package device 100 (or the common package of the system-in-package device) may comprise a lateral dimension of less than 5 cm×5 cm (or less than 2 cm×2 cm or less than 1 cm×1 cm).

Three electrical device components are mentioned in connection with the example shown in FIGS. 1A and 1B, although alternatively any number of components larger than 3 may be arranged in the common package 102.

Optionally, the system-in-package device 100 may comprise an internal redistribution layer structure for enabling electrical connections between the electrical device components of the system-in-package device 100 and/or for enabling electrical connections from external devices or a printed circuit board to one or more electrical device components (e.g. third electrical device component C) arranged within the common package 102 without direct access to the front side of the system-in-package device 100. The internal redistribution layer structure may comprise at least one structured metal layer (e.g. copper layer) implementing metal lines for routing embedded in electrically insulating material (e.g. poly imide, silicon oxide or silicon nitride). More than one structured metal layer (multi-layer redistribution structure) may be used for more complex routing.

For example, the system-in-package device 100 may comprise an (first) internal redistribution layer structure arranged (vertically) between the first electrical device component A 110 and the third electrical device component C 130. The internal redistribution layer structure may enable electrical connections between the first and/or second electrical device component B 120 and the third electrical device component C 130 and/or between the third electrical device component C 130 and an external devices or a printed circuit board.

For example, the internal redistribution layer structure may connect at least one vertical electrically conductive structure (e.g. via, through silicon via, through mold via TMV or via bar) located outside a lateral footprint of the first electrical device component A 110 or the third electrical device component C 130 (e.g. occupied area in a top view of the electrical device component) to the first electrical device component A 110 or the third electrical device component C 130. For example, the internal redistribution layer structure may enable a fan-out routing with respect to the first electrical device component A 110 and/or the third electrical device component C 130. The at least one vertical electrically conductive structure may connect the internal redistribution layer structure to a common front side redistribution structure (e.g. a common front side redistribution layer structure, a common panel structure or a common flip chip substrate).

Optionally, the system-in-package device 100 may comprise a second internal redistribution layer structure arranged vertically between a level of the first internal redistribution layer structure and a back side of the system-in-package device 100.

Figure 1C:
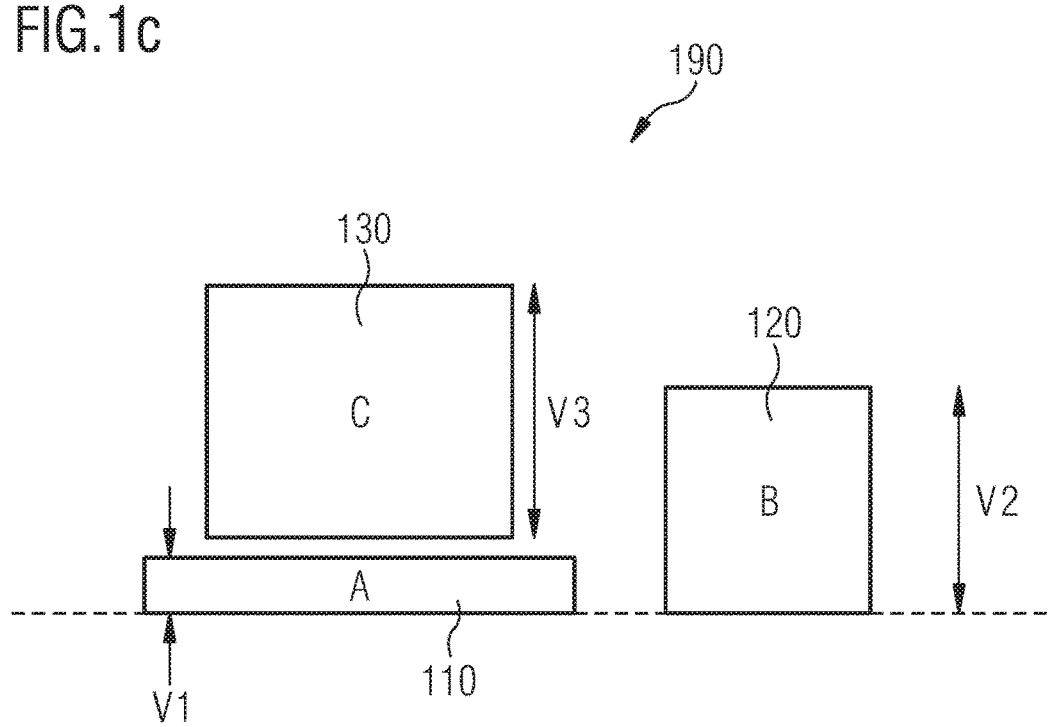
FIG. 1C shows a schematic cross section of another system-in-package device with at least three electrical device components.

FIG. 1C shows a schematic cross section of another system-in-package device 190 with at least three electrical device components according to an example. The implementation of the system-in-package device 190 is similar to the implementation described in connection with FIGS. 1A and 1B. However, the second vertical dimension VD2 is smaller than the third vertical dimension VD3.

The third electrical device component C 130 and the second electrical device component B 120 have a large vertical overlap so that a large reduction of the vertical height of the system-in-package device 190 may be enabled.

More details and aspects are mentioned in connection with the examples described above or below. The example shown in FIG. 1C may comprise one or more optional additional features corresponding to one or more aspects mentioned in connection with the proposed concept or one or more examples described above (e.g. FIGS. 1A and 1B) or below (e.g. FIG. 2A-12).

Figure 2A:
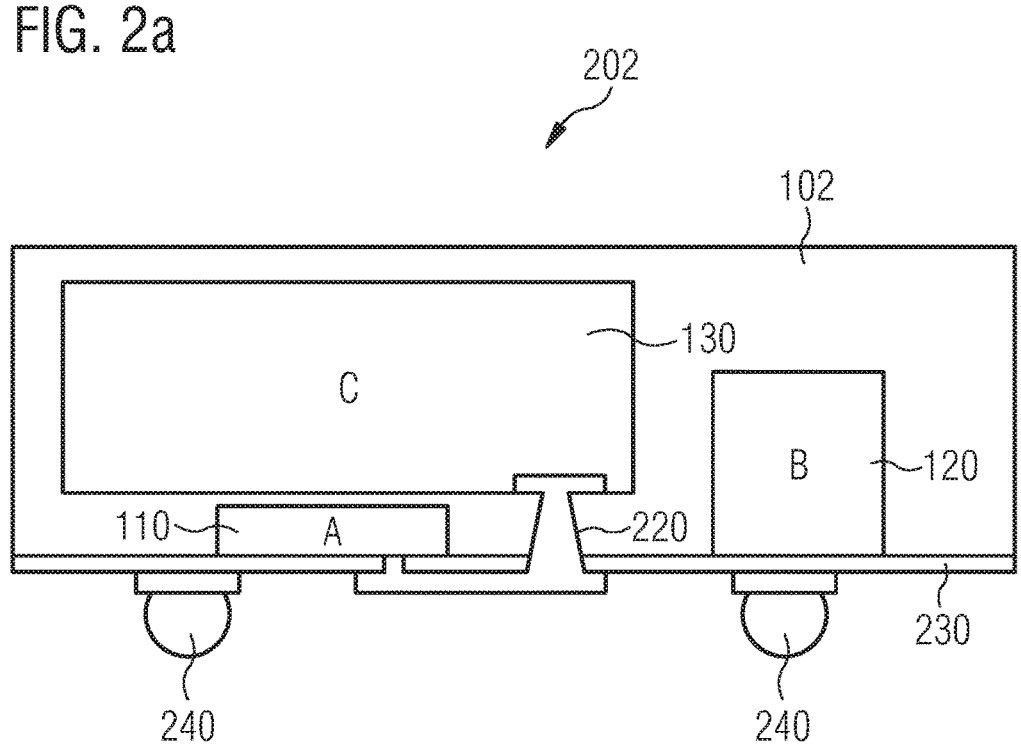
FIG. 2A shows a schematic cross section of a system-in-package device with three electrical device components.

FIG. 2A shows a schematic cross section of a system-in-package device 202 with three electrical device components according to an example. The implementation of the system-in-package device 190 is similar to the implementation described in connection with FIGS. 1A and 1B. The third electrical device component C 130 is arranged (directly) on top of the first electrical device component A 110 without a redistribution layer structure in between. The first electrical device component A 110 and the second electrical device component B 120 are arranged at a common front side redistribution structure 230 (e.g. a common front side redistribution layer structure, a common panel structure or a common flip chip substrate) and connected to the common front side redistribution structure 230 through contact interfaces 212, 222 (e.g. chip pads or solder balls). Further, the third electrical device component C 130 is connected to the common front side redistribution structure 230 by one or more vertical electrically conductive structures 220 (e.g. interconnects by through mold vias TMV or via bars). Solder balls 240 are attached to the common front side redistribution structure 230.

The connection to the third electrical device component C 130 may be implanted very efficient directly from the common front side redistribution structure through vias. An internal RDL may be avoided. The vias may be opened by laser. The laser ablation may be stopped by the metal pads (contact pads) of the third electrical device component C 130. The via metallization may be implemented simultaneously with the deposition of the redistribution layer RDL.

More details and aspects are mentioned in connection with the examples described above or below. The example shown in FIG. 2A may comprise one or more optional additional features corresponding to one or more aspects mentioned in connection with the proposed concept or one or more examples described above (e.g. FIG. 1A-1C) or below (e.g. FIG. 2B-12).

Figure 2B:
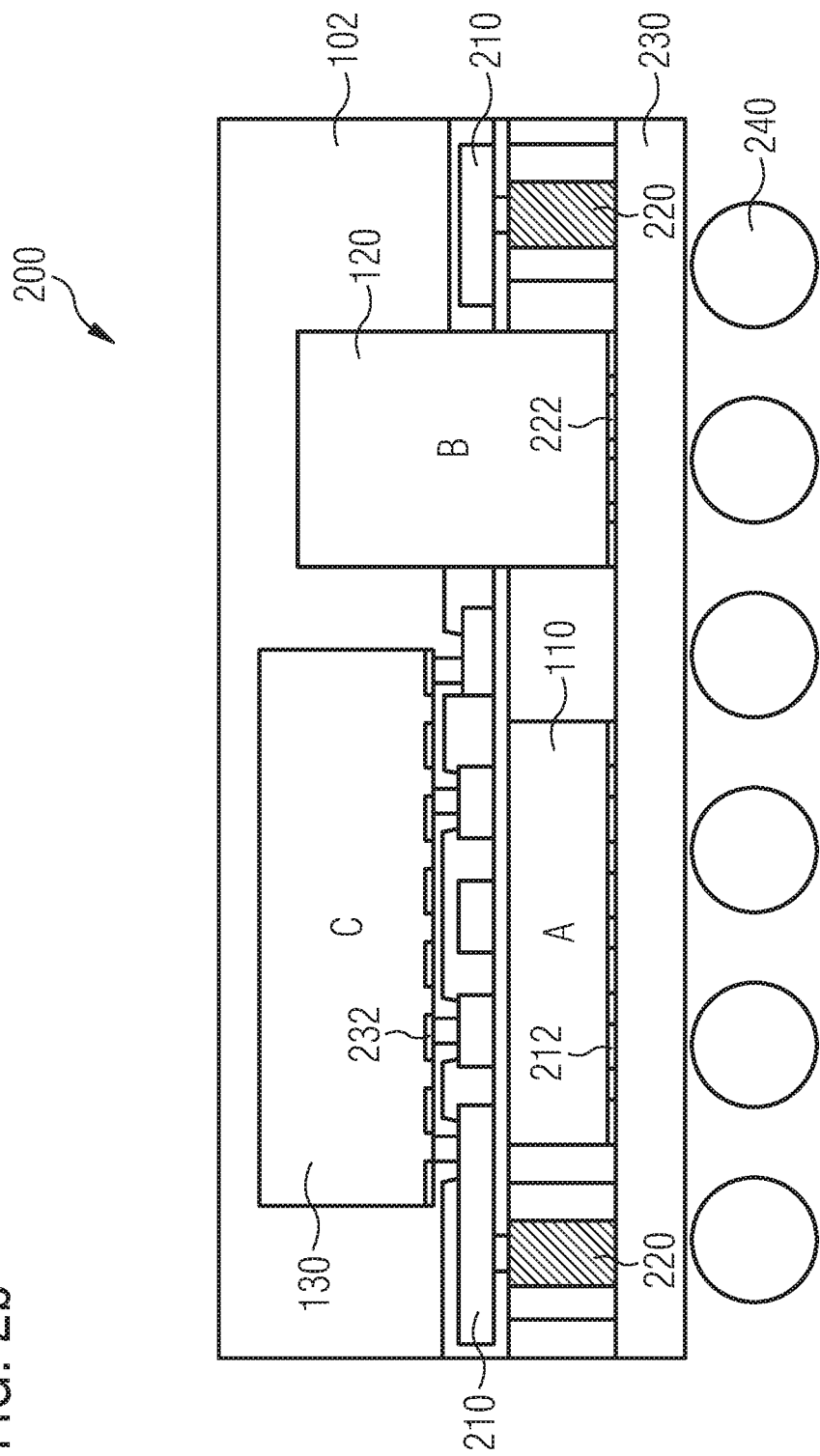
FIG. 2B shows a schematic cross section of a system-in-package device with three electrical device components and an internal redistribution layer structure.

FIG. 2B shows a schematic cross section of a system-in-package device 200 according to an example. The implementation of the system-in-package device 200 is similar to the implementation described in connection with FIGS. 1A and 1B. Additionally, the system-in-package device 200 comprises an internal redistribution layer structure 210 (e.g. back side redistribution layer BS RDL) located between the first electrical device component A 110 and the third electrical device component C 130. The first electrical device component A 110 and the second electrical device component B 120 are arranged at a common front side redistribution structure 230 (e.g. a common front side redistribution layer structure, a common panel structure or a common flip chip substrate) and connected to the common front side redistribution structure 230 through contact interfaces 212, 222 (e.g. chip pads or solder balls). Solder balls 240 are attached to the common front side redistribution structure 230. Further, some metal lines of the internal redistribution layer structure 210 are vertically connected to contact interfaces 232 of the third electrical device component C 130 and/or connected to the common front side redistribution structure 230 by vertical electrically conductive structures 220 (e.g. interconnects by through mold vias TMV or via bars). The first electrical device component A 110 and the second electrical device component B 120 may be embedded by a first molding compound MC1 of the common package 102 vertically between the internal redistribution layer structure 210 and the common front side redistribution structure 230. Further, the third electrical device component C 130 and the second electrical device component B 120 may be embedded by a second molding compound MC2 of the common package 102 vertically between the internal redistribution layer structure 210 and a back side of the system-in-package device 200.

FIG. 2B may show an example of a z-overlapping 3D stacking concept.

More details and aspects are mentioned in connection with the examples described above or below. The example shown in FIG. 2B may comprise one or more optional additional features corresponding to one or more aspects mentioned in connection with the proposed concept or one or more examples described above (e.g. FIG. 1A-2A) or below (e.g. FIGS. 3-12).

Figure 3:
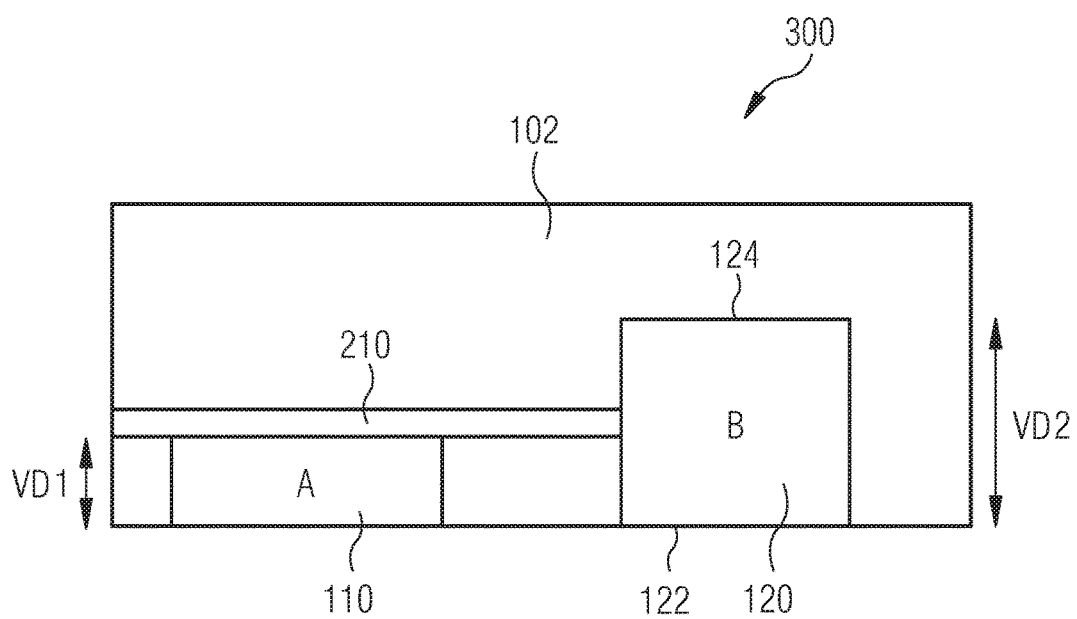
FIG. 3 shows a schematic cross section of a system-in-package device with at least two electrical device components and an internal redistribution layer structure.

FIG. 3 shows a schematic cross section of a system-in-package device 300 according to an example. The system-in-package device 300 comprises at least two electrical device components arranged in a common package 102. A first electrical device component A 110 of the at least two electrical device components comprises a first vertical dimension VD1 and a second electrical device component B 120 of the at least two electrical device components comprises a second vertical dimension VD2. Further, the second vertical dimension VD2 is larger than the first vertical dimension VD1. The first electrical device component A 110 and the second electrical device component B 120 are arranged side by side in the common package 102. Additionally, an internal redistribution layer structure 210 is arranged vertically between a front side level 122 of the second electrical device component B 120 and a back side level 124 of the second electrical device component B 120.

The dimensions of a device with several electrical components may be significantly reduced by arranging the electrical components within a common package. The dimensions of the device may be further reduced by arranging an internal redistribution layer structure on top of a thin component and placing a thicker component side by side to the thin component.

For example, a third electrical device component C may be arranged directly or indirectly on top of the redistribution layer structure. For example, the system-in-package device 300 comprises a third electrical device component C comprising a third vertical dimension and the second vertical dimension is larger than the third vertical dimension. The third electrical device component C may be arranged indirectly on top of the first electrical device component A in the common package. Optionally, at least a part of the third electrical device component C may be arranged vertically between a front side level of the second electrical device component B and a back side level of the second electrical device component B.

More details and aspects are mentioned in connection with the examples described above or below. The example shown in FIG. 3 may comprise one or more optional additional features corresponding to one or more aspects mentioned in connection with the proposed concept or one or more examples described above (e.g. FIG. 1A-2B) or below (e.g. FIGS. 4-12).

FIG. 4A shows a schematic comparison of a package on package stacking and a 3D die stacking. Two components are arranged side by side in a first package in the package on package example on the left side of FIG. 4A and a second package with a third component is mounted on the back side of the first package via a back side redistribution layer. The right side of FIG. 4a shows a system-in-package device with three components similar to the example shown in FIG. 2B. The system-in-package approach with lowered internal redistribution layer may provide a significant z-height reduction in comparison to the package on package approach.

For example, for some FO WL-packages the z-height of the highest component defines the minimum possible vertical gap between substrate (to which the component is coupled with its front side contacts) and package topside also called backside. For example, there may be an additional layer covering the component backside, like a 20-50 µm MC foil or dielectric layer. In case of a PoP approach backside contacts or an additional backside RDL may be formed on top of this bottom package backside to connect to interconnects of a top package. In case of placing one significant taller component side by side to one or more flat components this tall component may lead to a larger package z-height and therefore to a PoP-solution with large z-height, for example. According to the proposed approach the z-height level of the backside contacts or RDL may be lowered below the height of the tallest component. The tall component may rise up to the area beyond the backside RDL. On top of the lowered backside RDL additional top-components may be placed (3D-stacking) which may then be vertically overlapping to the tall component. For example, this is different to a PoP-approach where the top-components are part of a separate package which is placed on top of the bottom package). These top components and the extend of the tall bottom component may be then covered by an additional cap (e.g. MC). With this over-lapped 3D-stacking approach the tall component may be part of the "bottom" package as well as the "top" package (in comparison to the PoP). Finally this integrated arrangement may enable a much lower z-height than a PoP-approach. For example, FIG. 4A shows a PoP approach versus a proposed z-overlapping 3D stacking concept.

FIG. 4B shows a schematic comparison of two different 3D die stacks. Two components are arranged side by side and embedded by a first molding compound covering the two components in the first system-in-package approach on the left side of FIG. 4B and a third component is mounted on the back side of the first molding compound via a back side redistribution layer. The right side of FIG. 4B shows a system-in-package device with three components similar to the example shown in FIG. 2B. The second system-in-package approach with lowered internal redistribution layer may provide a significant z-height reduction in comparison to the first system-in-package approach.

Compared to a possible 3D-stacking method based on other examples of WL-Fanout package technology the z-height may be still significantly decreased (but less compared to PoP). For example, FIG. 4B shows a 3D stacking approach versus a proposed z-overlapping 3D stacking concept.

FIG. 5 shows a schematic comparison of a side by side arrangement and a 3D die stacking. Three components are arranged side by side in a common package in the side by side example at the right and the lower left cross section of FIG. 4A. The upper left cross section of FIG. 4a shows a system-in-package device with three components similar to the example shown in FIG. 2B. The system-in-package approach with lowered internal redistribution layer may provide a significant lateral size reduction (delta xy) in comparison to the side by side approach.

Compared to a side by side approach (SbS), the xy-dimension may be much lower because of the 3D-stacking while z-height may be almost the same. In the proposed approach the component 1 can be back grinded to thinner final thickness by following a die placing into cavity process flow (e.g. FIG. 7A-7F) than it is possible by the SbS-approach, where the component 1 is placed already with its final thickness (limited by pick and place process), for example. For example, FIG. 5 shows a SbS approach versus a proposed z-overlapping 3D stacking concept.

In the following a comparison of examples of different approaches are shown. For example, a comparison of xyz-dimensions for different above mentioned package constructions assuming usage of following components and geometries is shown:
Component 1,3 x/y/z: 3.0/3.0/0.5 mm
Component 2 x/y/z: 0.5/0.5/1.0 mm
Ball height: 0.25 mm, RDL-substrate 0.035 mm, BS-RDL 0.03 mm
Interconnects (PoP): x/y: 0.8/0.8 mm
Component 3 in separate package w/z-height 0.6 mm

| comparison | z-overlapping 3d | POP | SbS | 3D |
|---|---|---|---|---|
| xy-dim | 6 × 4 mm² | 6 × 4 mm² | 5 × 7 mm² | 6 × 4 mm² |
| z-height | 1.335 mm | 1.965 mm | 1.335 mm | 1.625 mm |

For the example of the z-overlapping 3D-stacking, a back grinding of embedded component1 to 0.2 mm is done and 0.2 mm (comp1)+0.03 mm (BS-RDL)+0.5 mm (comp3)=0.73 mm<1.0 mm (comp2) are calculated. An overall z-height of 0.25 mm (ball)+0.035 mm (RDL)+1.0 mm (comp2)+0.05 mm bs-mold=1.335 mm may be obtained.

For the example of the POP, a bottom package z-height 1.335 mm+0.03 mm (BS-RDL)=1.365 mm and top package z-height=0.6 mm is assumed. An overall z-height=1.965 mm is obtained.

For the example of the 3D stacking, a bottom package z-height 1.335 mm+0.03 mm (BS-DL) =1.365 mm and a die stacking (0.5 mm)+molding+grinding (−0.3 mm)+BSP (0.05 mm) is assumed. An overall z-height of 1.365+0.25 mm=1.625 mm is obtained.

For the example of the SbS, a z-height 1.335 mm, xy-dim=5×7 mm² instead of 6×4 mm² for the other constructions is obtained.

FIG. 6 shows a flow chart of a method for forming system-in-package devices according to an example. The method 600 comprises placing 610 a plurality of first electrical device components A comprising a first vertical dimension on a carrier and placing 620 a plurality of second electrical device components B comprising a second vertical dimension side by side to the first electrical device components on the carrier. The second vertical dimension is larger than the first vertical dimension. Further, the method 600 comprises placing 630 a plurality of third electrical device components C comprising a third vertical dimension directly or indirectly on top of the first electrical device components A. The second vertical dimension is larger than the third vertical dimension. At least a part of the third electrical device component C is arranged vertically between a front side level of the second electrical device component B and a back side level of the second electrical device component B.

The dimensions of a device with several electrical components may be significantly reduced by arranging the electrical components within a common package. The dimensions of the device may be further reduced by arranging thin components in a stack and placing thicker components side by side to the stack of thin components.

The carrier may be a metal carrier, a fan-out panel or a flip chip substrate, for example. For example, the first electrical device components A and the second electrical device components B may be attached to the carrier by an adhesive tape or another adhesive material.

A first component or structure may be arranged directly on top of a second component or structure, if the first component or structure is placed directly on a surface of the second component or structure (e.g. soldered to one or more backside contact interfaces of the second component). Alternatively, a first component or structure may be arranged indirectly on top of a second component or structure, if at least one intermediate layer or structure (e.g. redistribution layer structure) may be formed between the first component or structure and the second component or structure.

For example, an internal redistribution layer structure may be directly or indirectly formed on top of the first electrical device components A before placing the plurality of third electrical device components C. For example, the internal redistribution layer structure may be formed before or after placing the second electrical device components B.

Optionally, an electrically insulating layer (e.g. silicon oxide, silicon nitride, molding compound or poly imide) embedding the plurality of first electrical device components A may be formed before placing the plurality of second electrical device components B. The electrically insulating layer may hold the first electrical device components A in place. Additionally, the plurality of first electrical device components A may be thinned from a side opposite to the carrier (e.g. back side of the first electrical device components A). In this way, the vertical dimension of the resulting system-in-package device may be further reduced. Alternatively, an electrically insulating layer (e.g. silicon oxide, silicon nitride, molding compound or poly imide) embedding the plurality of first electrical device components A and the plurality of second electrical device components B may be formed after placing the second electrical device components B before placing the plurality of third electrical device components C. The electrically insulating layer may hold the first and second electrical device components B in place.

Additionally, a molding compound may be deposited after placing the plurality of third electrical device components C to enclose at least a part of each second electrical device component B of the plurality of second electrical device components B and at least a part of each third electrical device component C of the plurality of third electrical device components C. The molding compound may implement a back side protective layer for protecting the device components against environmental influences.

A plurality of same electrical device components (e.g. first electrical device components A, second electrical device components B and/or electrical device components) may be placed (e.g. simultaneously) at the carrier to enable a parallel manufacturing of several system-in-package devices simultaneously. For example, the electrical device components of a plurality of system-in-package devices are placed at an area to be molded by a common molding process. For example, a molding wafer may be obtained by embedding the electrical device components of the plurality of system-in-package devices in a molding compound. The system-in-package devices may be separated from each other afterwards (e.g. by sawing or laser cutting).

For example, the carrier may be removed after placing the third electrical device components C (e.g. and also after forming a molding compound embedding at least the third electrical device components C) and a common front side redistribution layer structure may be formed at the front side surfaces of the first and second electrical device components B. The common front side redistribution layer structure may enable an electrical connection between the different electrical device components and/or one or more of the different electrical device components and one or more external devices or a printed circuit board.

More details and aspects are mentioned in connection with the examples described above or below. The example shown in FIG. 6 may comprise one or more optional additional features corresponding to one or more aspects mentioned in connection with the proposed concept or one or more examples described above (e.g. FIG. 1A-5) or below (e.g. FIGS. 7-12).

In the following, some examples of possible process flows for the implementation of a backside metallization (e.g. intermediate redistribution layer structure) lower than the topside (back side) of the tallest (largest vertical dimension) component.

Figure 7A:
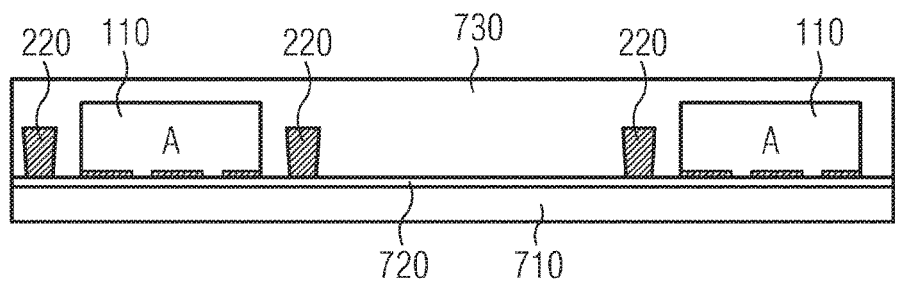
FIG. 7A-7F show schematic cross sections of system-in-package devices at different stages of a manufacturing process.
Figure 7B:
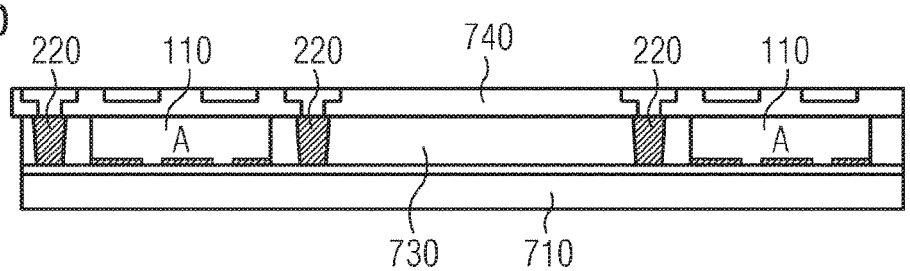
Figure 7C:
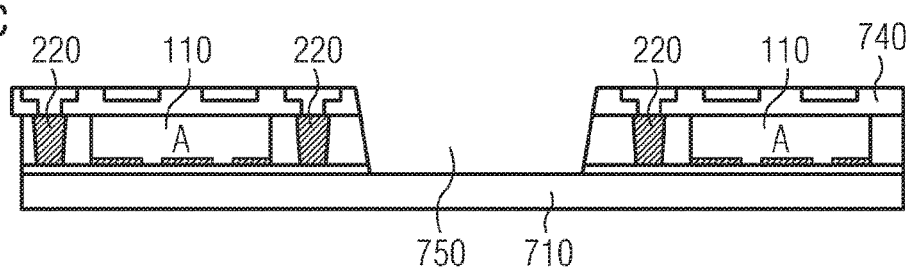
Figure 7D:
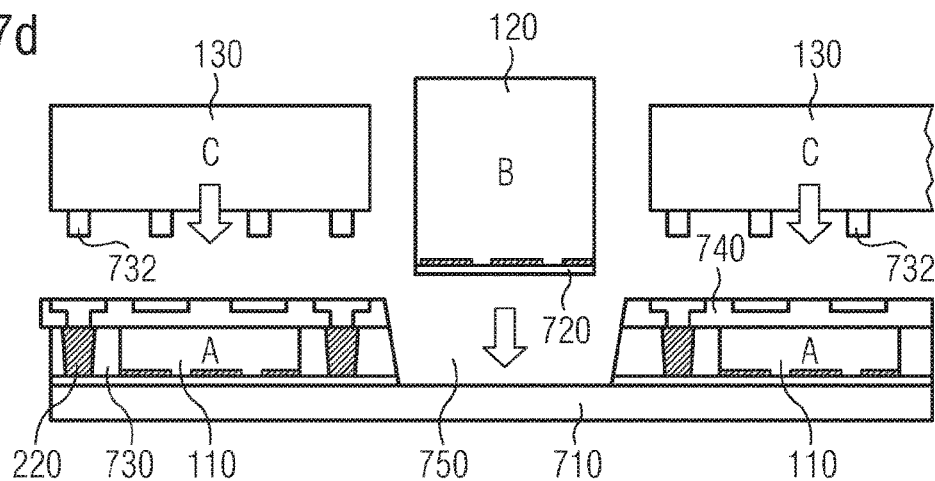
Figure 7E:
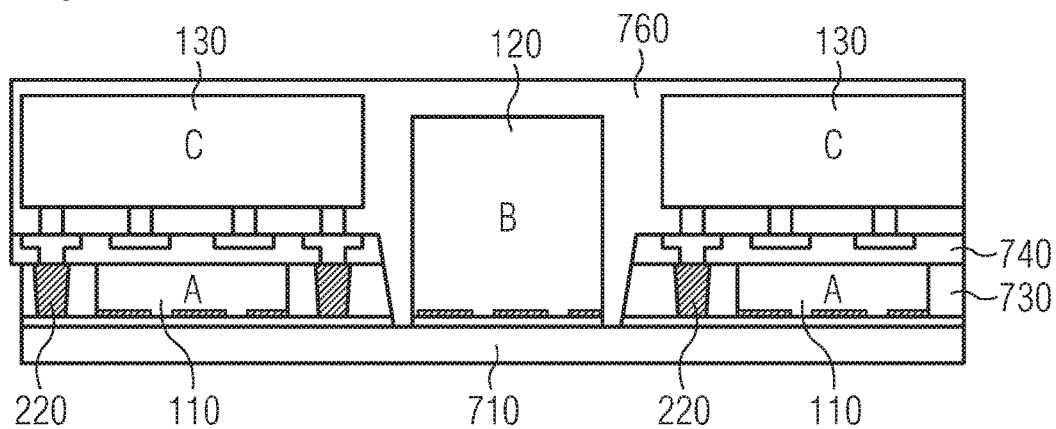
Figure 7F:
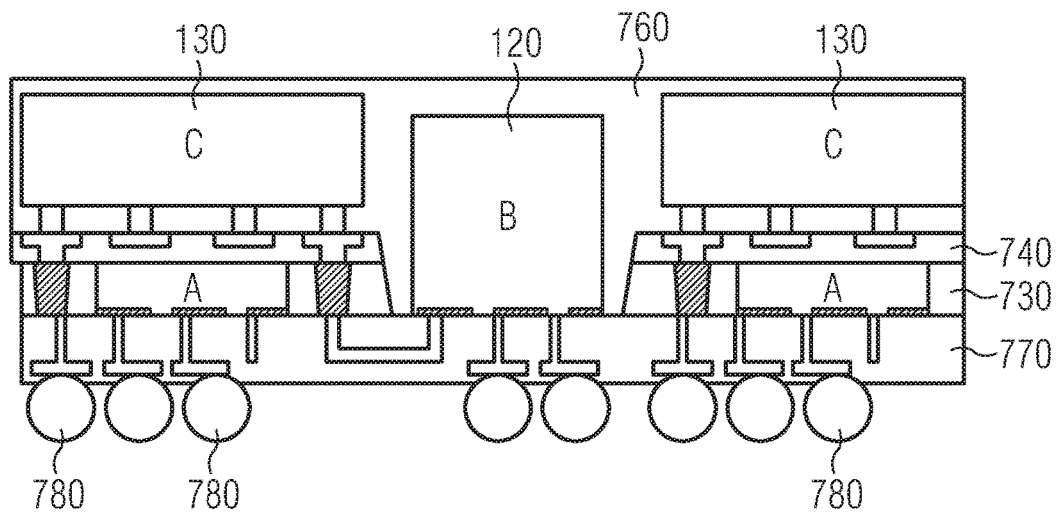

FIG. 7A-7F show schematic cross sections of system-in-package devices at different stages of a manufacturing process according to an example. This example shows an implementation using a die placing (of the plurality of second electrical device components B) into a cavity (e.g. laser drilled). The plurality of first electrical device components A 110 (e.g. dies) and vertical electrically conductive structures 220 (e.g. via bars) are attached to a carrier 710 with an adhesive layer 720 (e.g. adhesive tape) and a molding compound 730 (e.g. alternatively silicon oxide or poly imide) is formed to embed the first electrical device components A 110 and the vertical electrically conductive structures 220 as shown in FIG. 7A. Further, FIG. 7B shows back grinding (e.g. thinning the dies of the first electrical device components A to a thickness between 100 μm and 200 μm) and forming a back side redistribution layer 740 (e.g. intermediate redistribution layer structure). Afterwards, cavities 750 are formed (e.g. by laser or etching) for placing the second electrical device components B 120 as shown in FIG. 7C. Then, the tall components 120 (second electrical device components B) are placed with adhesive tapes 720 on the bottom side (front side) into the cavities 750. Further, bumped top dies (third electrical device components C with solder bumps or solder balls at the front side) are placed on the back side redistribution layer 740 as shown in FIG. 7D. After placement of the third electrical device components C 130, a second molding compound is formed to embed the second electrical device components B 120 and the third electrical device components C 130 as shown in FIG. 7E. Optionally, a second grinding process may be done to thin the second electrical device components B 120 and/or the third electrical device components C 130. Afterwards, the carrier may be removed and a front side redistribution layer 770 may be formed (e.g. using a dielectric cured at temperatures below 250° C. embedding electrical conductive redistribution connections). Further, solder balls 780 may be applied to the front side redistribution layer 770 as shown in FIG. 7F. The devices may be separated from etch other between the right side of the second electrical device components B 120 and the left side of the first electrical device components A 110 in FIG. 7F.

More details and aspects are mentioned in connection with the examples described above or below. The example shown in FIG. 7 may comprise one or more optional additional features corresponding to one or more aspects mentioned in connection with the proposed concept or one or more examples described above (e.g. FIG. 1A-6) or below (e.g. FIGS. 8-12).

Figure 8A:
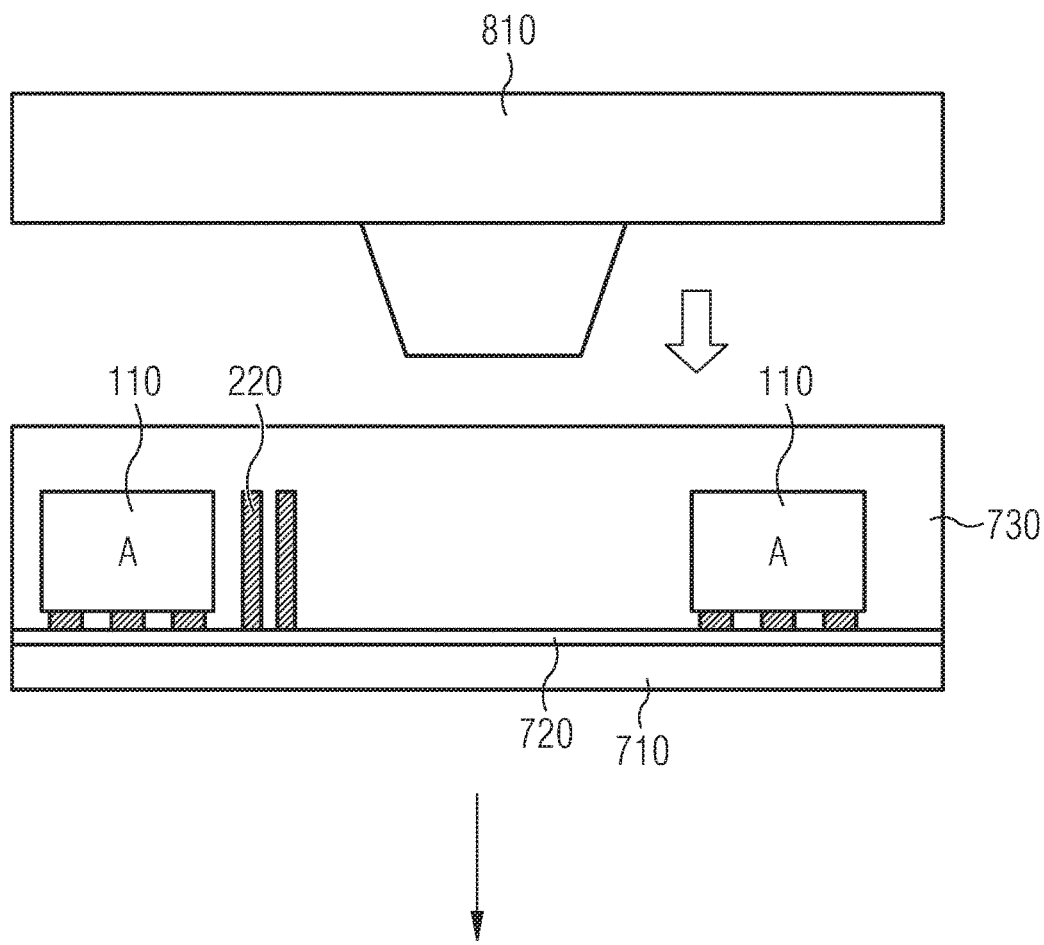
FIG. 8A-8D show schematic cross sections of system-in-package devices at different stages of another manufacturing process.
Figure 8B:
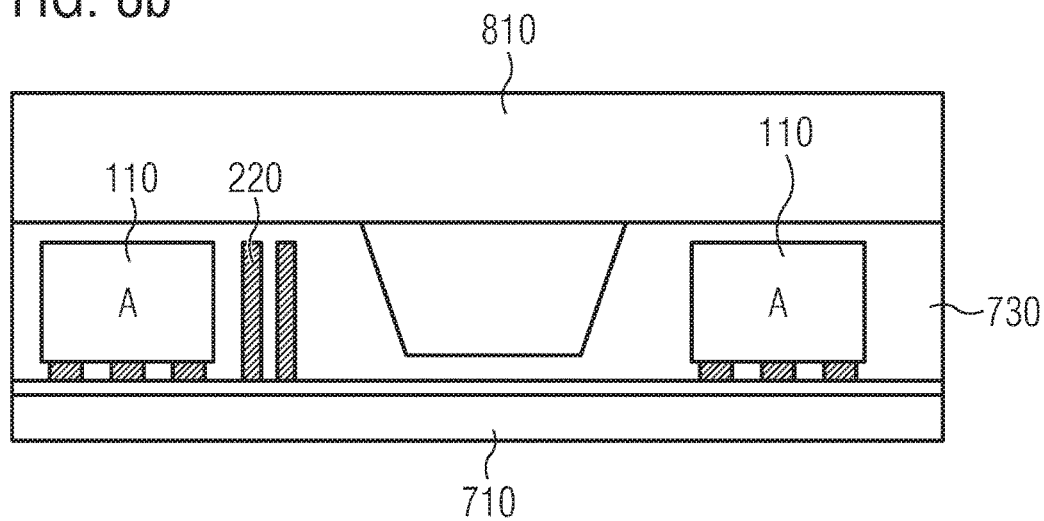
Figure 8C:
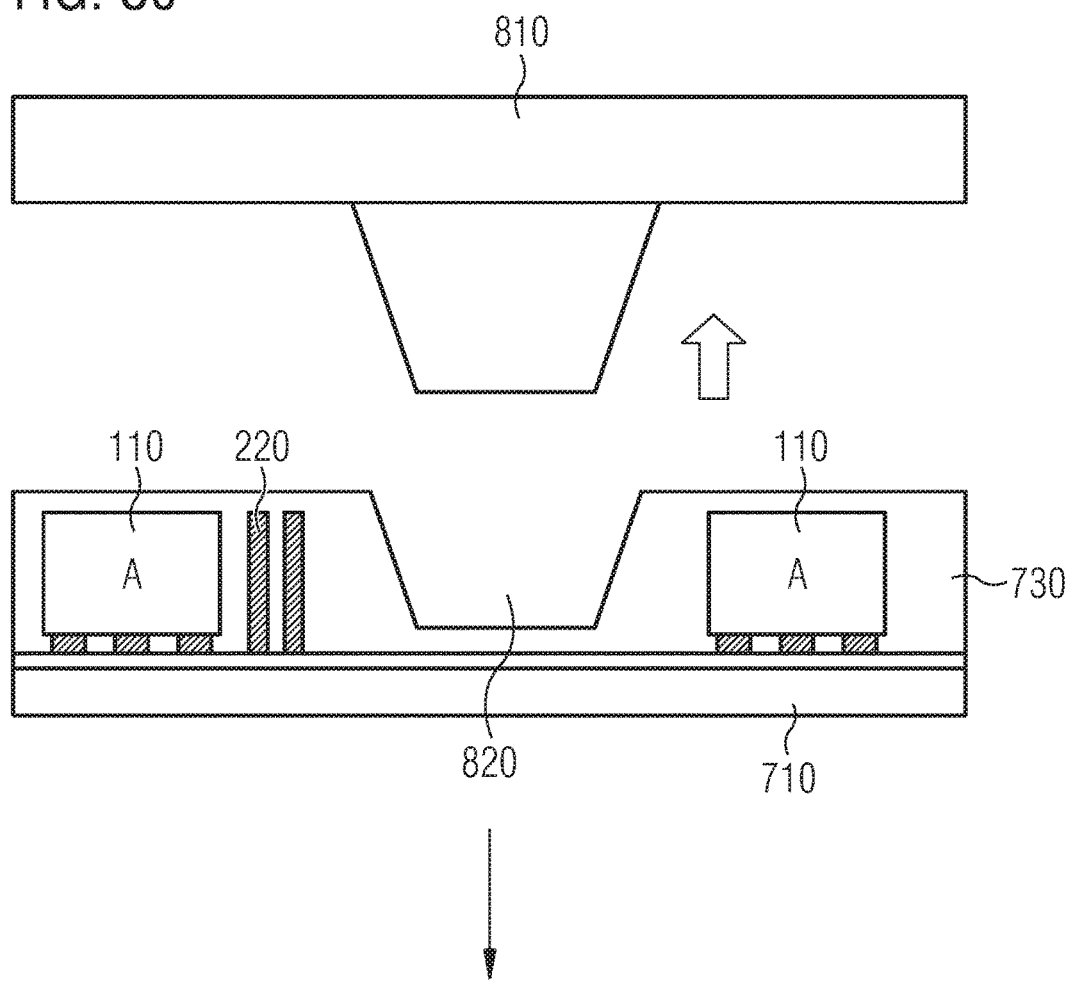
Figure 8D:
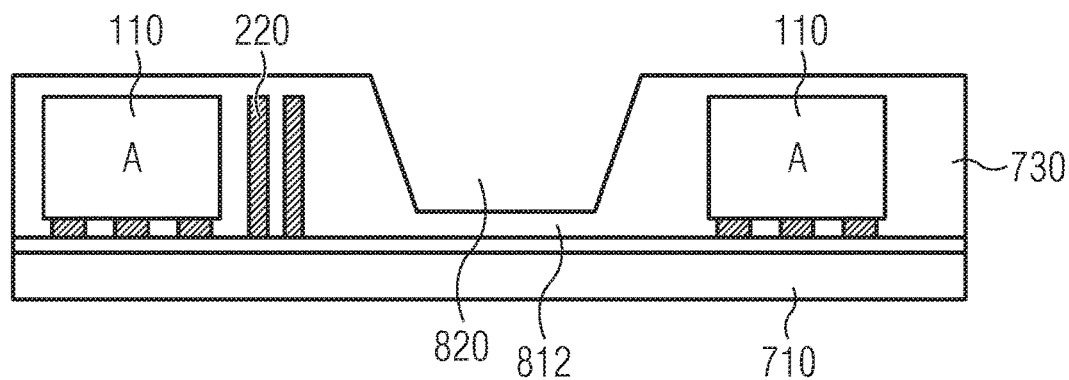

FIG. 8A-8D show schematic cross sections of system-in-package devices at different stages of a manufacturing process according to an example. This example shows an implementation using a die placing (of the plurality of second electrical device components B) into in-tender formed cavities. The plurality of first electrical device components A 110 (e.g. dies) and vertical electrically conductive structures 220 (e.g. via bars) are attached to a carrier 710 with an adhesive layer (e.g. adhesive tape) and a molding compound 730 (e.g. alternatively silicon oxide or poly imide) is formed to embed the first electrical device components A 110 and the vertical electrically conductive structures 220 as shown in FIG. 8A. Further, FIG. 8B shows an indenter 810 (e.g. steel plate) pressed into the molding compound 730 to form cavities. Afterwards, the molding compound 730 is cured (e.g. heated) and the indenter 810 is removed after curing so that the cavities 820 remain as shown in FIG. 8C. Optionally, remaining molding compound residues 812 may be removed (e.g. by laser drilling or etching). Then, the method 800 may be continued with forming an internal redistribution layer and the processes shown in FIG. 7D-7F, for example.

For example, a die placement into a cavity may allow a significant thinning by back grinding before placing the tall component from about 500 µm down to 100-200 µm. This may enable to lower the backside-RDL to a lower level than in some of the following process options where the tall component may be placed together with the other components (the plurality of first electrical device components A).

More details and aspects are mentioned in connection with the examples described above or below. The example shown in FIG. 8 may comprise one or more optional additional features corresponding to one or more aspects mentioned in connection with the proposed concept or one or more examples described above (e.g. FIG. 1A-7) or below (e.g. FIGS. 9-12).

Figure 9D:
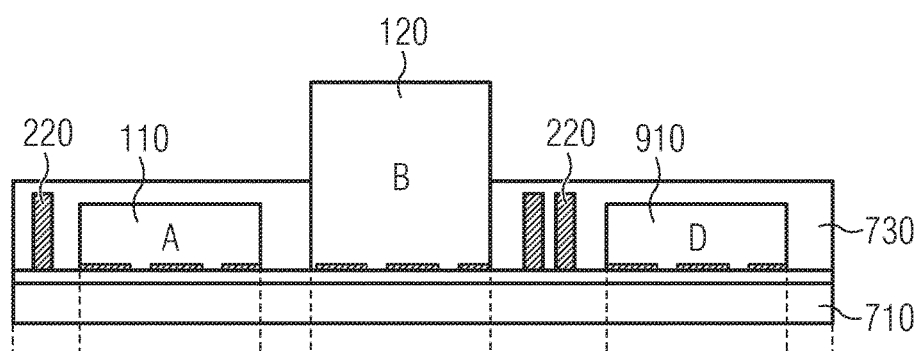
Figure 9E:
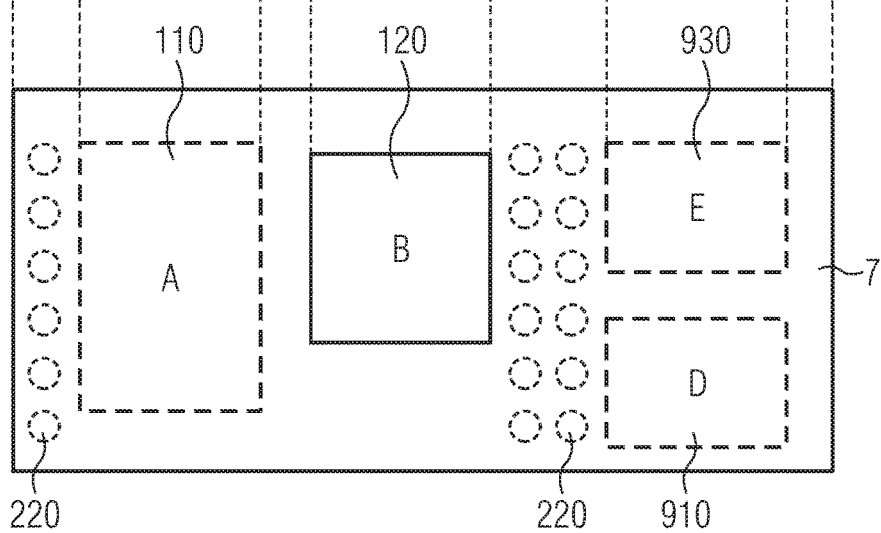

FIG. 9A-9E show schematic cross sections and a schematic top view of a system-in-package device at different stages of a manufacturing process. This example shows an implementation using a leveling via a resist planarization process by dry etching. A single device is shown, although a plurality of devices may be manufactured at the same time. A first electrical device component A 110, a second electrical device component B 120, a fourth electrical device component D 910, a fifth electrical device component E 930 and vertical electrically conductive structures 220 (e.g. via bars) are attached to a carrier 710 with an adhesive layer (e.g. adhesive tape) and an electrical insulating material 730 (e.g. silicon oxide, silicon nitride, poly imide, photo resists, a soft dielectric material or molding compound) is formed to embed the first electrical device component A 110, the second electrical device component B 120, the fourth electrical device components D 910, the fifth electrical device components E 930 and the vertical electrically conductive structures 220 as shown in FIG. 9A. Further, FIG. 9B shows a uniform soft dry etch 920 of the electrical insulating material 730. A significantly lower etch rate (or substantially zero etch rate) occurs at the (second) component topside as shown in FIGS. 9C and 9D. Further, FIG. 9E shows a schematic top view after the soft dry etch 920. The second electrical device component B 120 is uncovered after the soft dry etch 920, while the first electrical device component A 110, the fourth electrical device components D 910, the fifth electrical device components E 930 and the vertical electrically conductive structures 220 are still covered by the electrical insulating material 730 (dashed lines).

Additionally, the method may be continued with forming an internal redistribution layer and the processes shown in FIG. 7D-7F or with the processes shown in the following FIGS. 10A-10G, for example.

More details and aspects are mentioned in connection with the examples described above or below. The example shown in FIG. 9 may comprise one or more optional additional features corresponding to one or more aspects mentioned in connection with the proposed concept or one or more examples described above (e.g. FIG. 1A-8) or below (e.g. FIGS. 10-12).

Figure 10A:
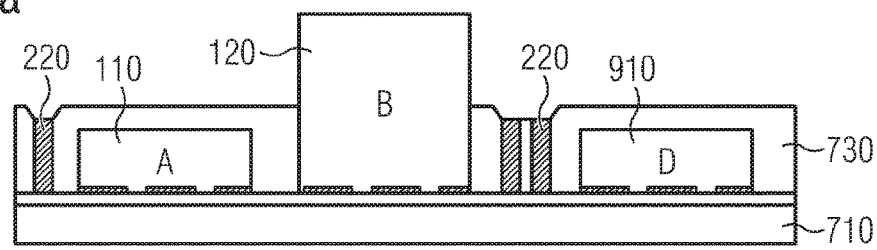
FIG. 10A-10G show schematic cross sections of system-in-package devices at different stages of another manufacturing process.
Figure 10B:
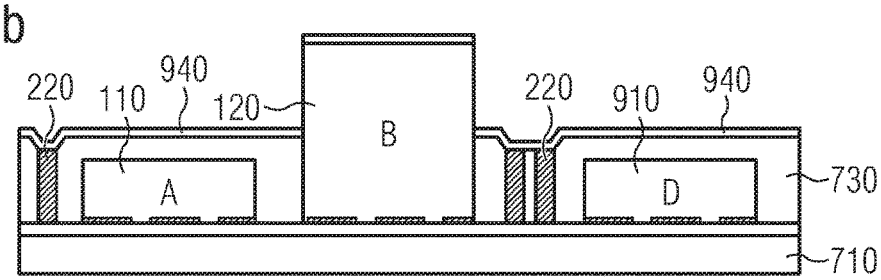
Figure 10C:
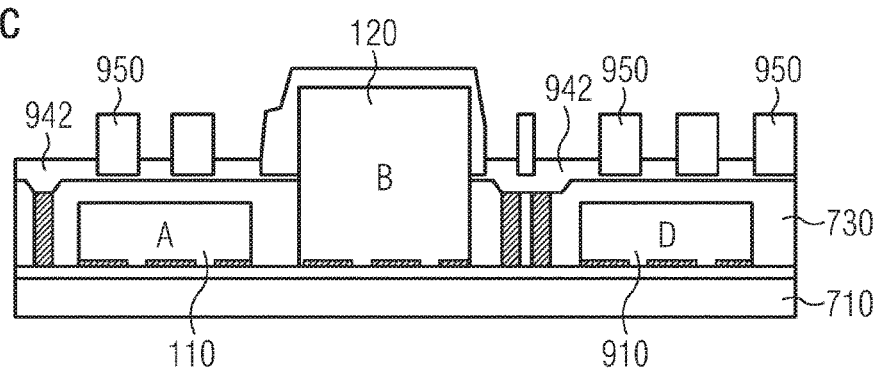
Figure 10D:
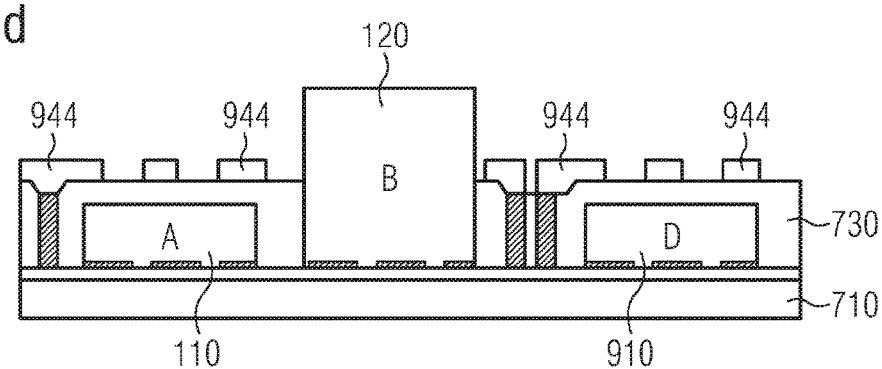
Figure 10E:
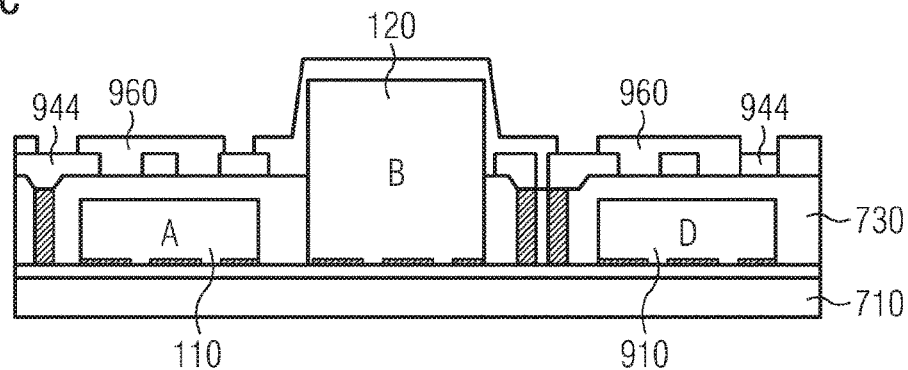
Figure 10F:
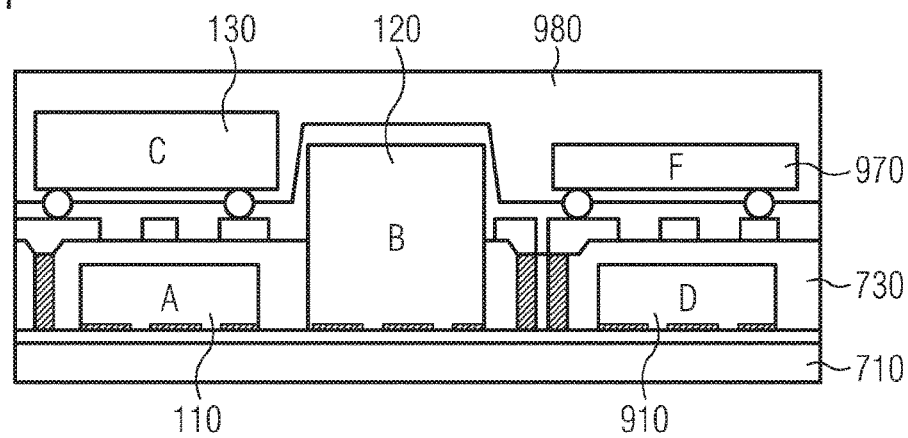
Figure 10G:
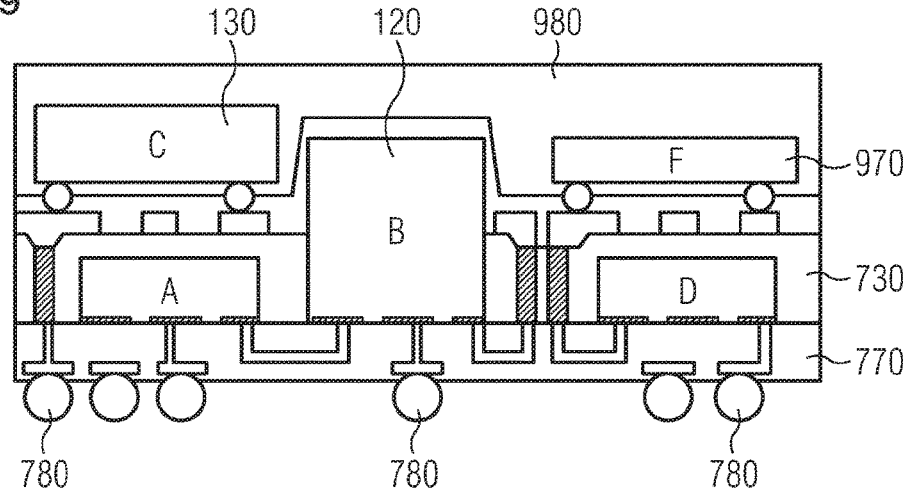

FIG. 10A-10G show schematic cross sections of a system-in-package device at different stages of a manufacturing process according to an example. This example shows processes following the processes shown FIG. 9A-9E, for example. FIG. 10A shows the opening (removing remaining electrical insulating material) of the vertical electrically conductive structures 220 (e.g. through molding vias or via bars) by laser (or etching). The opening may be skipped, if the structures are already uncovered. Further, a seed layer 940 (e.g. copper) is formed at the surface after uncovering the vertical electrically conductive structures 220 as shown in FIG. 10B. FIG. 10C shows the formation of a masking resist structure 950. Further, a copper plating process is performed to form electrical conductive redistribution connections 942 at unmasked areas. Then, the resist structure 950 is stripped and the seed layer 940 is etched at the previously masked areas as shown in FIG. 10D. Further, a back side solder mask structure 960 is processed to define contact areas for attaching further electrical device components as shown in FIG. 10E. Afterwards, a third electrical device component C 130 and a sixth electrical device component F 970 (e.g. dies) are attached (e.g. soldered) to the contact areas of the electrical conductive redistribution connections 942, which are uncovered by the back side solder mask structure 960. Further, a (second) molding compound 980 is formed embedding at least the third electrical device component C 130 and the sixth electrical device component F 970 as shown in FIG. 10F. Afterwards, the carrier may be removed and a front side redistribution layer 770 may be formed. Further, solder balls 780 may be applied to the front side redistribution layer 770 as shown in FIG. 10G.

More details and aspects are mentioned in connection with the examples described above or below. The example shown in FIG. 10 may comprise one or more optional additional features corresponding to one or more aspects mentioned in connection with the proposed concept or one or more examples described above (e.g. FIG. 1A-9) or below (e.g. FIGS. 11-12).

Figure 11A:
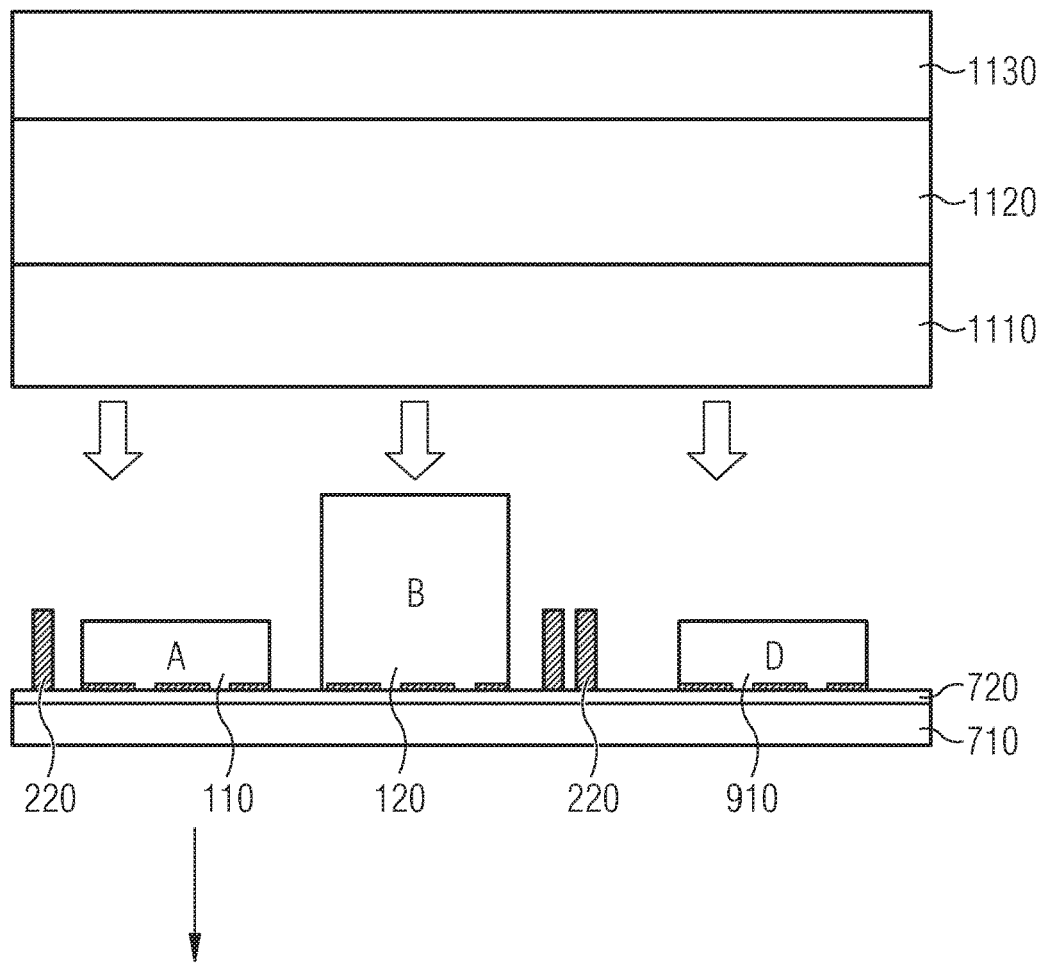
Figure 11B:
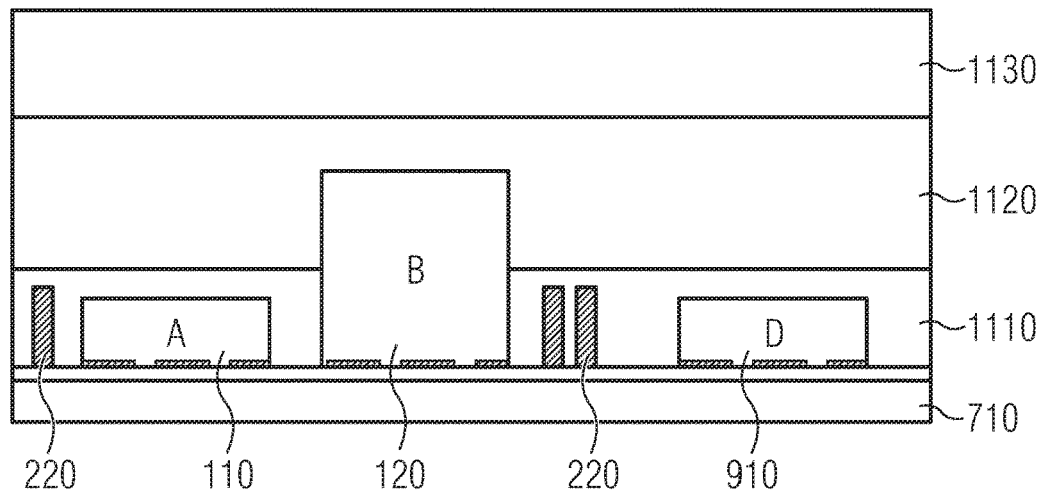

FIG. 11A-11D show schematic cross sections of a system-in-package device at different stages of a manufacturing process according to an example. This example shows an implementation using a flexible sheet molding. A single device is shown, although a plurality of devices may be manufactured at the same time. A first electrical device component A 110, a second electrical device component B 120, a fourth electrical device component D 910 (and optionally a fifth electrical device component E as shown in FIG. 9E) and vertical electrically conductive structures 220 (e.g. via bars) are attached to a carrier 710 with an adhesive layer (e.g. adhesive tape). Further, a molding compound sheet 1110 arranged on a flexible sheet 1120 arranged on a carrier plate 1130 (e.g. steel plate) is pressed down to the first electrical device component A 110, the second electrical device component B 120, the fourth electrical device component D 910 and the vertical electrically conductive structures 220 to embed the electrical device components and the vertical electrically conductive structures 220 in the molding compound sheet 1110 as shown in FIG. 11A. Then the molding compound may be cured as shown in FIG. 11B. Further, the flexible sheet 1120 is released and the carrier plate 1130 is raised after curing as shown in FIG. 11C and FIG. 11D. Afterwards, the method may be continued with forming an internal redistribution layer and the processes shown in FIG. 7D-7F or with the processes shown in FIGS. 10A-10G, for example.

More details and aspects are mentioned in connection with the examples described above or below. The example shown in FIG. 11 may comprise one or more optional additional features corresponding to one or more aspects mentioned in connection with the proposed concept or one or more examples described above (e.g. FIG. 1A-10) or below (e.g. FIG. 12).

Figure 12:
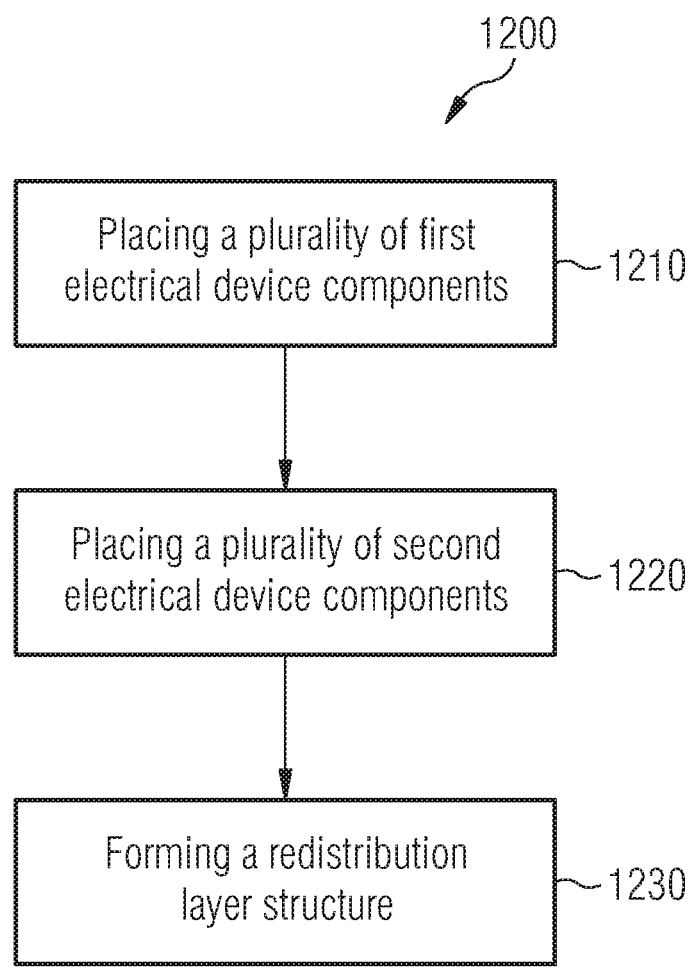
FIG. 12 shows a flow chart of a method for forming system-in-package devices.

FIG. 12 shows a flow chart of a method for forming system-in-package devices according to an example. The method 1200 comprises placing 1210 a plurality of first electrical device components A comprising a first vertical dimension on a carrier and placing 1220 a plurality of second electrical device components B comprising a second vertical dimension side by side to the first electrical device components A on the carrier. The second vertical dimension is larger than the first vertical dimension. Further, the method 1200 comprises forming 1230 a redistribution layer structure directly or indirectly on top of the plurality of first electrical device components A so that the redistribution layer structure is arranged vertically between a front side level of the second electrical device component B and a back side level of the second electrical device component B.

The dimensions of a device with several electrical components may be significantly reduced by arranging the electrical components within a common package. The dimensions of the device may be further reduced by arranging an internal redistribution layer structure on top of a thin component and placing a thicker component side by side to the thin component.

Additionally, a plurality of third electrical device components C may be placed directly or indirectly on top of the redistribution layer structure.

More details and aspects are mentioned in connection with the examples described above or below. The examples shown in FIG. 12 may comprise one or more optional additional features corresponding to one or more aspects mentioned in connection with the proposed concept or one or more examples described above (e.g. FIG. 1A-11) or below.

Some examples relate to a 3D stacking method for components with different z-height. The proposed concept may be used in connection with 3D stacking, flip chip packages, fan-out panel packages, fan-out wafer level packages, package on packages and/or system in packages. For example, 3D stacking of components with different z-height in Fan-out Waferlevel or Panel-packaging technologies may be enabled. The proposed concept may be implemented in high volume architecture as computer system architecture features & interfaces made in high volumes, may encompass IA (integrated architectures), devices (e.g. transistors) and associated manufacturing (mfg) processes, for example.

For example, a method for 3D-integration of components with different z-heights into a SiP-package with optimized z-height and xy-dimensions based on wafer level fan out packaging technology may be proposed, which may be called z-overlapping 3D-stacking approach.

Some examples, relate to an introduction of a z-overlapping 3D-stacking method into a waferlevel fanout technology by lowering the BS-RDL to a z-height level lower than the tallest component.

In comparison to a PoP approach (e.g. large z-height component is either part of bottom or top package, means total z-height is given by the sum of z-heights of bottom and top package), the proposed concept may allow significant smaller total z-height at same xy-dimension and usage of more standard components which are not optimized in z-height by vendor (e.g. system cost impact), for example. An example may be shown in FIG. 4A.

In comparison to a SbS approach (e.g. large z-height components and flat components are placed side by side leading to large xy-dimensions), the proposed concept may allow significant smaller xy-dimension at same or comparable z-height. An example may be shown in FIG. 5.

In comparison to a possible 3D-stacking for WL-FO (e.g. same as PoP but instead of a separate Top package a die is e.g. bumped on the backside of the bottom package and then embedded into mold compound), the proposed concept may allow significant smaller total z-height at same xy-dimension (e.g. z-height reduction may be less significant compared to PoP-approach) and may allow usage of more standard components which are not optimized in z-height by vendor (e.g. system cost impact), for example. An example may be shown in FIG. 4B.

For example, passive and active components with different z-dimensions may be integrated into a wafer level fanout package with minimum form factor. A form factor optimized wafer level package using standard components may be provided.

Some aspects relate to the implementation of different backside-RDL-levels, a BS extrusion (e.g. tall component bs is not covered by mold compound which may enable an interaction with environment, e.g. air pressure measurement), a higher stacking levels like 3 stacked dies or more, an application for panel FO packaging technologies and/or an application for FC SiP packages.

In the following, some examples are described. Example 1 is a system-in-package device comprising at least three electrical device components arranged in a common package, wherein a first electrical device component of the at least three electrical device components comprises a first vertical dimension, a second electrical device component of the at least three electrical device components comprises a second vertical dimension and a third electrical device component of the at least three electrical device components comprises a third vertical dimension, wherein the second vertical dimension is larger than the first vertical dimension, wherein the first electrical device component and the second electrical device component are arranged side by side in the common package, wherein the third electrical device component is arranged on top of the first electrical device component in the common package, wherein at least a part of the third electrical device component is arranged vertically between a front side level of the second electrical device component and a back side level of the second electrical device component.

In example 2, the subject matter of example 1 can optionally include an internal redistribution layer structure being arranged between the first electrical device component and the third electrical device component.

In example 3, the subject matter of example 2 can optionally include the internal redistribution layer structure connecting at least one vertical electrically conductive structure located outside a lateral footprint of the first electrical device component or the third electrical device component to the first electrical device component or the third electrical device component.

In example 4, the subject matter example 3 can optionally include the at least one vertical electrically conductive structure connecting the internal redistribution layer structure to a common front side redistribution structure.

In example 5, the subject matter of examples 2-4 can optionally include a second internal redistribution layer structure being arranged vertically between a level of the first internal redistribution layer structure and a back side of the system-in-package device.

In example 6, the subject matter of examples 1-5 can optionally include the common package comprising a molding compound portion enclosing at least a part of the second electrical device component and at least a part of the third electrical device component.

In example 7, the subject matter of examples 1-6 can optionally include at least one of the at least three electrical device components being a semiconductor device.

In example 8, the subject matter of examples 1-7 can optionally include at least one of the at least three electrical device components being at least one of the group of a central processing unit, a memory device, a transmitter device, a receiver device and a transceiver device.

In example 9, the subject matter of examples 1-8 can optionally include each of the at least three electrical device components being at least one of the group of a semiconductor device, an integrated passive device, a micro-electro-mechanical system device, a surface mounted device and a package of an electrical device.

In example 10, the subject matter of examples 1-9 can optionally include a front side surface of the first electrical device component and a front side surface of the second electrical device component being arranged on substantially the same level.

In example 11, the subject matter of examples 1-10 can optionally include contact interfaces at a front side of the first electrical device component and contact interfaces at a front side of the second electrical device component being connected to a common front side redistribution structure.

In example 12, the subject matter of example 11 can optionally include the common front side redistribution structure being one of the group of a common front side redistribution layer structure, a common panel structure and a common flip chip substrate.

In example 13, the subject matter of examples 1-12 can optionally include the system-in-package device comprising a vertical dimension of less than a sum of the first vertical dimension, the second vertical dimension and the third vertical dimension.

In example 14, the subject matter of examples 1-13 can optionally include the system-in-package device comprising a vertical dimension of less than 5 mm.

In example 15, the subject matter of examples 1-14 can optionally include the system-in-package device comprising a lateral dimension of less than a sum of a lateral dimension of the first electrical device component, a lateral dimension of the second electrical device component and a lateral dimension of the third electrical device component.

In example 16, the subject matter of examples 1-15 can optionally include the second vertical dimension being larger than the third vertical dimension.

In example 17, the subject matter of examples 1-16 can optionally include the system-in-package device comprising a lateral dimension of less than 5 cm×5 cm.

In example 18, the subject matter of examples 1-17 can optionally include the common package being a fan-out wafer-level system-in-package, a fan-out panel system-in-package or a flip chip system-in-package.

Example 19 relates to a system-in-package device comprising at least two electrical device components arranged in a common package, wherein a first electrical device component of the at least two electrical device components comprises a first vertical dimension and a second electrical device component of the at least two electrical device components comprises a second vertical dimension, wherein the second vertical dimension is larger than the first vertical dimension, wherein the first electrical device component and the second electrical device component are arranged side by side in the common package, wherein an internal redistribution layer structure is arranged vertically between a front side level of the second electrical device component and a back side level of the second electrical device component.

In example 20, the subject matter of example 19 can optionally include a third electrical device component comprising a third vertical dimension, wherein the second vertical dimension is larger than the third vertical dimension, wherein the third electrical device component is arranged on top of the first electrical device component in the common package.

Example 21 relates to a method for forming system-in-package devices comprising placing a plurality of first electrical device components comprising a first vertical dimension on a carrier, placing a plurality of second electrical device components comprising a second vertical dimension side by side to the first electrical device components on the carrier, wherein the second vertical dimension is larger than the first vertical dimension and placing a plurality of third electrical device components comprising a third vertical dimension directly or indirectly on top of the first electrical device components, wherein at least a part of the third electrical device component is arranged vertically between a front side level of the second electrical device component and a back side level of the second electrical device component.

In example 22, the subject matter of example 21 can optionally include forming an internal redistribution layer structure directly or indirectly on top of the first electrical device components before placing the plurality of third electrical device components.

In example 23, the subject matter of example 21 or 22 can optionally include the carrier being one of the group of a metal carrier, a fan-out panel or a flip chip substrate.

In example 24, the subject matter of examples 21-23 can optionally include depositing a molding compound after placing the plurality of third electrical device components to enclose at least a part of each second electrical device component of the plurality of second electrical device components and at least a part of each third electrical device component of the plurality of third electrical device components.

In example 25, the subject matter of examples 21-24 can optionally include forming an electrically insulating layer embedding the plurality of first electrical device components before placing the plurality of second electrical device components.

In example 26, the subject matter of example 25 can optionally include thinning the plurality of first electrical device components from a side opposite to the carrier.

In example 27, the subject matter of examples 25-26 can optionally include forming an internal redistribution layer structure directly or indirectly on top of the first electrical device components before placing the plurality of second electrical device components.

In example 28, the subject matter of examples 21-27 can optionally include forming an electrically insulating layer embedding the plurality of first electrical device components and the plurality of second electrical device components before placing the plurality of third electrical device components.

In example 29, the subject matter of example 28 can optionally include forming an internal redistribution layer structure directly or indirectly on top of the first electrical device components after forming the electrically insulating layer.

In example 30, the subject matter of examples 21-29 can optionally include removing the carrier and forming a common front side redistribution layer structure.

Example 31 relates to a method for forming system-in-package devices comprising placing a plurality of first electrical device components comprising a first vertical dimension on a carrier, placing a plurality of second electrical device components comprising a second vertical dimension side by side to the first electrical device components on the carrier, wherein the second vertical dimension is larger than the first vertical dimension and forming a redistribution layer structure directly or indirectly on top of the plurality of first electrical device components so that the redistribution layer structure is arranged vertically between a front side level of the second electrical device component and a back side level of the second electrical device component.

In example 32, the subject matter of example 31 can optionally include placing a plurality of third electrical device components directly or indirectly on top of the redistribution layer structure.

Example 33 is a machine readable storage medium including program code, when executed, to cause a machine to perform the method of example 21 or 31.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

The invention claimed is:

1. A system-in-package device comprising at least three electrical device components arranged in a common package,
wherein a first electrical device component of the at least three electrical device components comprises a first vertical dimension, a second electrical device component of the at least three electrical device components comprises a second vertical dimension and a third electrical device component of the at least three electrical device components comprises a third vertical dimension, wherein the second vertical dimension is larger than the first vertical dimension,
wherein the first electrical device component and the second electrical device component are arranged side by side in the common package,
wherein the third electrical device component is arranged on top of the first electrical device component in the common package, wherein at least a part of the third electrical device component is arranged vertically between a front side level of the second electrical device component and a back side level of the second electrical device component,
wherein an internal redistribution layer structure is arranged vertically between a front side level of the second electrical device component and a back side level of the second electrical device component.

2. The system-in-package device according to claim 1, wherein an internal redistribution layer structure is arranged between the first electrical device component and the third electrical device component.

3. The system-in-package device according to claim 2, wherein the internal redistribution layer structure connects at least one vertical electrically conductive structure located outside a lateral footprint of the first electrical device component or the third electrical device component to the first electrical device component or the third electrical device component.

4. The system-in-package device according to claim 3, wherein the at least one vertical electrically conductive structure connects the internal redistribution layer structure to a common front side redistribution structure.

5. The system-in-package device according to claim 2, wherein a second internal redistribution layer structure is arranged vertically between a level of the first internal redistribution layer structure and a back side of the system-in-package device.

6. The system-in-package device according to claim 1, wherein the common package comprises a molding compound portion enclosing at least a part of the second electrical device component and at least a part of the third electrical device component.

7. The system-in-package device according to claim 1, wherein at least one of the at least three electrical device components is a semiconductor device.

8. The system-in-package device according to claim 1, wherein at least one of the at least three electrical device components is at least one of the group of a central processing unit, a memory device, a transmitter device, a receiver device and a transceiver device.

9. The system-in-package device according to claim 1, wherein each of the at least three electrical device components is at least one of the group of a semiconductor device, an integrated passive device, a micro-electro-mechanical system device, a surface mounted device and a package of an electrical device.

10. The system-in-package device according to claim 1, wherein a front side surface of the first electrical device component and a front side surface of the second electrical device component are arranged on substantially the same level.

11. The system-in-package device according to claim 1, wherein contact interfaces at a front side of the first electrical device component and contact interfaces at a front side of the second electrical device component are connected to a common front side redistribution structure.

12. The system-in-package device according to claim 11, wherein the common front side redistribution structure is one of the group of a common front side redistribution layer structure, a common panel structure and a common flip chip substrate.

13. The system-in-package device according to claim 1, wherein the system-in-package device comprises a vertical dimension of less than a sum of the first vertical dimension, the second vertical dimension and the third vertical dimension.

14. The system-in-package device according to claim 1, wherein the system-in-package device comprises a vertical dimension of less than 5 mm.

15. The system-in-package device according to claim 1, wherein the system-in-package device comprises a lateral dimension of less than a sum of a lateral dimension of the first electrical device component, a lateral dimension of the second electrical device component and a lateral dimension of the third electrical device component.

16. The system-in-package device according to claim 1, wherein the second vertical dimension is larger than the third vertical dimension.

17. The system-in-package device according to claim 1, wherein the system-in-package device comprises a lateral dimension of less than 5 cm×5 cm.

18. The system-in-package device according to claim 1, wherein the common package is a fan-out wafer-level system-in-package, a fan-out panel system-in-package or a flip chip system-in-package.

19. A system-in-package device comprising at least two electrical device components arranged in a common package,
wherein a first electrical device component of the at least two electrical device components comprises a first vertical dimension and a second electrical device component of the at least two electrical device components comprises a second vertical dimension, wherein the second vertical dimension is larger than the first vertical dimension, wherein the first electrical device component and the second electrical device component are arranged side by side in the common package,
wherein an internal redistribution layer structure is arranged vertically between a front side level of the second electrical device component and a back side level of the second electrical device component.

20. The system-in-package device according to claim 19, further comprising a third electrical device component comprising a third vertical dimension, wherein the second vertical dimension is larger than the third vertical dimension, wherein the third electrical device component is arranged on top of the first electrical device component in the common package.

21. A method for forming system-in-package devices comprising:
placing a plurality of first electrical device components comprising a first vertical dimension on a carrier;
placing a plurality of second electrical device components comprising a second vertical dimension side by side to the first electrical device components on the carrier, wherein the second vertical dimension is larger than the first vertical dimension,
placing a plurality of third electrical device components comprising a third vertical dimension directly or indirectly on top of the first electrical device components, wherein at least a part of the third electrical device component is arranged vertically between a front side level of the second electrical device component and a back side level of the second electrical device component,
wherein an internal redistribution layer structure is arranged vertically between a front side level of the second electrical device component and a back side level of the second electrical device component.

22. The method according to claim 21, further comprising forming an internal redistribution layer structure directly or indirectly on top of the first electrical device components before placing the plurality of third electrical device components.

23. The method according to claim 21, wherein the carrier is one of the group of a metal carrier, a fan-out panel or a flip chip substrate.

24. A method for forming system-in-package devices comprising:
placing a plurality of first electrical device components comprising a first vertical dimension on a carrier;
placing a plurality of second electrical device components comprising a second vertical dimension side by side to the first electrical device components on the carrier, wherein the second vertical dimension is larger than the first vertical dimension; and
forming a redistribution layer structure directly or indirectly on top of the plurality of first electrical device components so that the redistribution layer structure is arranged vertically between a front side level of the second electrical device component and a back side level of the second electrical device component.

25. The method according to claim 24, further comprising placing a plurality of third electrical device components directly or indirectly on top of the redistribution layer structure.

* * * * *